United States Patent
Shimizu et al.

(10) Patent No.: US 8,436,397 B2
(45) Date of Patent: May 7, 2013

(54) SEMICONDUCTOR DEVICE INCLUDING NORMALLY-OFF TYPE JUNCTION TRANSISTOR AND METHOD OF MANUFACTURING THE SAME

(75) Inventors: Haruka Shimizu, Kodaira (JP); Natsuki Yokoyama, Mitaka (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 166 days.

(21) Appl. No.: 12/639,054

(22) Filed: Dec. 16, 2009

(65) Prior Publication Data

US 2010/0163935 A1     Jul. 1, 2010

(30) Foreign Application Priority Data

Dec. 22, 2008    (JP) ................................. 2008-325724

(51) Int. Cl.
*H01L 29/80* (2006.01)
(52) U.S. Cl.
USPC ............................ 257/135; 257/134; 257/335
(58) Field of Classification Search .................. 257/134, 257/135, 335
See application file for complete search history.

(56) References Cited

U.S. PATENT DOCUMENTS

| 6,855,981 B2* | 2/2005 | Kumar et al. ................. 257/328 |
| 6,906,356 B1* | 6/2005 | Chang ........................... 257/130 |
| 7,355,223 B2* | 4/2008 | Harris et al. .................. 257/256 |
| 2004/0135178 A1 | 7/2004 | Onose et al. | |
| 2005/0151158 A1* | 7/2005 | Kumar et al. ................. 257/134 |

FOREIGN PATENT DOCUMENTS

JP     2004-134547 A    4/2004

* cited by examiner

*Primary Examiner* — Howard Weiss
*Assistant Examiner* — Tifney Skyles
(74) *Attorney, Agent, or Firm* — Miles & Stockbridge P.C.

(57) ABSTRACT

In a junction FET of a normally-off type, a technique capable of achieving both of improvement of a blocking voltage and reduction of an ON resistance is provided. In a junction FET using silicon carbide as a substrate material, impurities are doped to a vicinity of a p-n junction between a gate region and a channel-formed region, the impurities having a conductive type which is reverse to that of impurities doped in the gate region and same as that of impurities doped in the channel-formed region. In this manner, an impurity profile of the p-n junction becomes abrupt, and further, an impurity concentration of a junction region forming the p-n junction with the gate region in the channel-formed region is higher than those of a center region in the channel-formed region and of an epitaxial layer.

11 Claims, 34 Drawing Sheets

SEMICONDUCTOR DEVICE INCLUDING NORMALLY-OFF TYPE JUNCTION TRANSISTOR AND METHOD OF MANUFACTURING THE SAME

CROSS-REFERENCE TO RELATED APPLICATION

The present application claims priority from Japanese Patent Application No. JP 2008-325724 filed on Dec. 22, 2008, the content of which is hereby incorporated by reference into this application.

TECHNICAL FIELD OF THE INVENTION

The present invention relates to a semiconductor device and a technique of manufacturing the same. More particularly, the present invention relates to a technique effectively applied to a junction FET (field effect transistor) using a material having a band gap wider than that of single silicon and a technique of manufacturing the same.

BACKGROUND OF THE INVENTION

Japanese Patent Application Laid-Open Publication No. 2004-134547 (Patent Document 1) discloses a technique aiming at obtaining a semiconductor device capable of achieving excellent electric properties by improving a low ON resistance and a blocking effect with ion implantation at relatively low energy. More specifically, to achieve this aim, a trench is formed on a source-side surface in a drift region, a p-type gate region and a gate electrode are provided on a bottom portion of the trench, and a source electrode is formed on an entire surface of a unit device via an insulating film. Also, a narrowest portion of a channel is made deeper than one half of a junction in the p-type gate region. In this manner, a width of a drain-side channel can be narrowed even in ion implantation at low energy, so that the blocking effect in the p-type gate region can be increased.

SUMMARY OF THE INVENTION

A semiconductor power device includes an $n^+$ drain region formed of a substrate, an $n^-$ drift region formed of an epitaxial layer formed on the $n^+$ drain region, an $n^+$ source region formed on the $n^-$ drift region, a trench extending to the $n^-$ drift region so as to penetrate the $n^+$ source region, and a p-type gate region formed on a bottom portion of the trench.

In the semiconductor power device as structured above, there is a tradeoff relation defined by a band gap of a substrate material between reduction of an ON resistance and improvement of blocking voltage. That is, to achieve the improvement of blocking voltage, an insulation breakdown field strength of the substrate material has to be ensured. Therefore, when silicon is used as the substrate material of the semiconductor power device, a thickness of the $n^-$ drift region is thickened and an impurity concentration of the $n^-$ drift region is set to be low, so that the insulating breakdown field strength is ensured, and the blocking voltage is improved. However, when the thickness of the $n^-$ drift region is thickened and the impurity concentration of the $n^-$ drift region is set to be low to ensure the blocking voltage, an ON resistance between the $n^+$ source region and the $n^+$ drain region is increased. That is, in the semiconductor power device, there is the tradeoff relation between improvement of the blocking voltage and reduction of the ON resistance.

Here, since the insulating breakdown field strength depends on a magnitude of the band gap of the substrate material, the blocking voltage is easily ensured by using a material with a large band gap as the substrate material. That is, when a material with a band gap larger than that of silicon is used as the substrate material, the blocking voltage can be ensured without thickening the thickness of the $n^-$ drift region and setting the impurity concentration of the $n^-$ drift region to be low as the case of silicon. That is, by using the material with the band gap larger than that of silicon as the substrate material, the thickness of the $n^-$ drift region can be thinner and the impurity concentration of the $n^-$ drift region can be higher than the case of silicon in order to ensure the blocking voltage equivalent to that in the case of silicon. As a result, the ON resistance between the $n^+$ source region and the $n^+$ drain region can be decreased.

In this manner, in order to exceed performances of a silicon device widely used as the semiconductor power device, it is effective to use a substrate material with a band gap larger than that of silicon. More particularly, silicon carbide (SiC) has features such as having a sufficiently large band gap which is about three times larger than that of silicon, allowing easy formation of p-type and n-type of a conductive type, and allowing formation of an oxide film by thermal oxidation, and therefore, SiC has a possibility of achieving a high-performance device such as a metal oxide semiconductor field effect transistor (MOSFET), and attracts huge attention.

However, a silicon oxide film formed on a silicon carbide has a large problem. The problem is that, when silicon carbide is subjected to thermal oxidation, carbon remains in the silicon oxide film, and a high-density interface state is formed. Accordingly, channel mobility of the MOSFET is significantly deteriorated, and the ON resistance is remarkably increased. Moreover, the carbon in the silicon oxide film may also cause deterioration in reliability of the silicon oxide film, and is a large barrier against achieving the MOSFET.

There is a junction FET as a device structure for avoiding the problem of the interface state caused at the interface of the silicon oxide film. The junction FET is a device of channel ON/OFF control type by forming a p-n junction between a channel-formed region and a gate layer and controlling a width of a depletion layer extending from the p-n junction. Normally, a junction FET of a normally-ON type is used, in which a negative voltage is applied to the gate layer to extend the depletion layer into the channel-formed region so that the channel is OFF. However, from a point of view of fail safe, usage of the junction FET of the normally-ON type is limited. That is, normally, in the junction FET of the normally-ON type, the channel is turned ON to carry a current, and when the channel is required to be turned off, a negative voltage is applied to the gate layer to extend the depletion layer from the p-n junction to turn OFF the channel. Therefore, if the junction FET is broken due to some reason, the current continues to flow as the channel is ON. No current flow is normally desirable even if the junction FET is broken in a point of view of safety. However, in the junction FET of the normally-ON type, the current continues to flow even if the junction FET is broken, and therefore, the usage is limited.

Accordingly, a normally-OFF type is generally desired for the semiconductor power device. Here, in a junction FET using silicon of the normally-OFF type, it is difficult to provide a high blocking voltage. This is because, since a built-in potential of the silicon p-n junction is low, the depletion layer does not sufficiently extend from the p-n junction when no voltage is applied to the gate layer, and therefore, the channel cannot be completely turned OFF. That is, in the silicon junction FET, a negative voltage has to be applied to the gate layer to turn the channel OFF, and therefore, it is difficult to achieve the normally-off state. Compared to this, as for a junction FET using silicon carbide, a high blocking voltage can be achieved by narrowing the channel width in a junction FET of a normally-OFF type. This is because, since a built-in potential of the silicon-carbide p-n junction is high at about 2.5 V, the depletion layer sufficiently extends, so that the channel can be completely depleted without applying the negative voltage to the gate layer. In this manner, a high-performance semiconductor power device can be achieved regardless of the interface of the silicon oxide film in the junction FET of the normally-OFF type.

Generally, in the junction FET of the normally-OFF type using silicon carbide, the gate layer is formed by ion implantation. Therefore, a gradual p-n junction is formed between the gate layer and the channel. This is because, since impurities hardly diffuse in silicon carbide, high-energy ion implantation is required in order to form a box profile. In the gradual p-n junction, a potential in a vicinity of the p-n junction is easy to be influenced by a drain bias in a blocking state, and this causes decrease of the blocking voltage. In order to increase the blocking voltage, the channel has to be narrowed, and as a result, a current volume in the ON state is decreased. That is, the ON resistance is increased.

On the other hand, as a structure that the potential in a vicinity of the p-n junction is difficult to be influenced by the drain bias, there is a high impurity concentration of the channel. This is because, by making a concentration of the entire channel higher than that of the $n^-$ drift layer, the impurity concentration in the vicinity of the p-n junction is totally lead to higher, so that fluctuation of the potential in the vicinity of the p-n junction can be suppressed. In this manner, the blocking voltage of the semiconductor power device is improved. However, when the impurity concentration of the channel is increased, the blocking voltage cannot be ensured unless the channel is further narrowed. As a result, the semiconductor power device is easy to be influenced by variations in a dimension, and therefore, variations in device characteristics become large.

A preferred aim of the present invention is to provide a technique of both improving blocking voltage and reducing ON-resistance in a normally-off junction FET.

The above and other preferred aims and novel characteristics of the present invention will be apparent from the description of the present specification and the accompanying drawings.

The typical ones of the inventions disclosed in the present application will be briefly described as follows.

A semiconductor device according to the typical embodiment includes: (a) a substrate of a first conductive type to be a drain layer; (b) an epitaxial layer of a first conductive type formed on the substrate; and (c) a plurality of trenches each formed so as to reach an inside of the epitaxial layer from a surface of the epitaxial layer. And, it includes: (d) a source layer of a first conductive type formed on a surface region of the epitaxial layer interposed between trenches adjacent to each other; and (e) a gate layer of a second conductive type formed in the epitaxial layer so as to contact with side walls and a bottom portion of each of the plurality of trenches. Further, it includes: (f) a channel-formed region of a first conductive type formed in the epitaxial layer between the gate layers adjacent to each other; (g) a drain electrode formed on a rear surface of the substrate; (h) a source electrode formed so as to connect to the source layer; and (i) a gate electrode formed so as to connect to the gate layer. Here, an impurity concentration of a junction region forming a p-n junction with the gate layer in the channel-formed region is higher than those of a center region in the channel-formed region and of the epitaxial layer.

Also, a method of manufacturing a semiconductor device according to the typical embodiment includes the steps of: (a) preparing a substrate of a first conductive type to be a drain layer; (b) forming an epitaxial layer of a first conductive type on the substrate; and (c) forming a source layer of a first conductive type in a surface region of the epitaxial layer. And, it includes the steps of: (d) forming a plurality of trenches so as to reach an inside of the epitaxial layer from a surface of the epitaxial layer; and (e) forming a gate layer of a second conductive type in the epitaxial layer so as to contact with side walls and a bottom surface of each of the plurality of trenches. Further, it includes the steps of: (f) in a channel-formed region of a first conductive type interposed between the gate layers adjacent to each other, doping impurities of a first conductive type to junction regions on the channel-formed region side forming a p-n junction with the gate layer and on the gate layer side forming the p-n junction; and (g) forming a source electrode so as to connect to the source layer. Subsequently, it includes the steps of: (h) forming a gate electrode so as to connect to the gate layer; and (i) forming a drain electrode so as to connect to the drain layer on a rear surface of the substrate. Here, an impurity concentration of the junction region forming the p-n junction with the gate layer in the channel-formed region is higher than those of a center region in the channel-formed region and of the epitaxial layer.

The effects obtained by typical aspects of the present invention will be briefly described below.

In a normally-off junction FET, both of improving blocking voltage and reducing ON-resistance are possible.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments, and the repetitive description thereof is omitted. Note that, hatching is used even in a plan view so as to make the drawings easy to see.

First Embodiment

Figure 1:
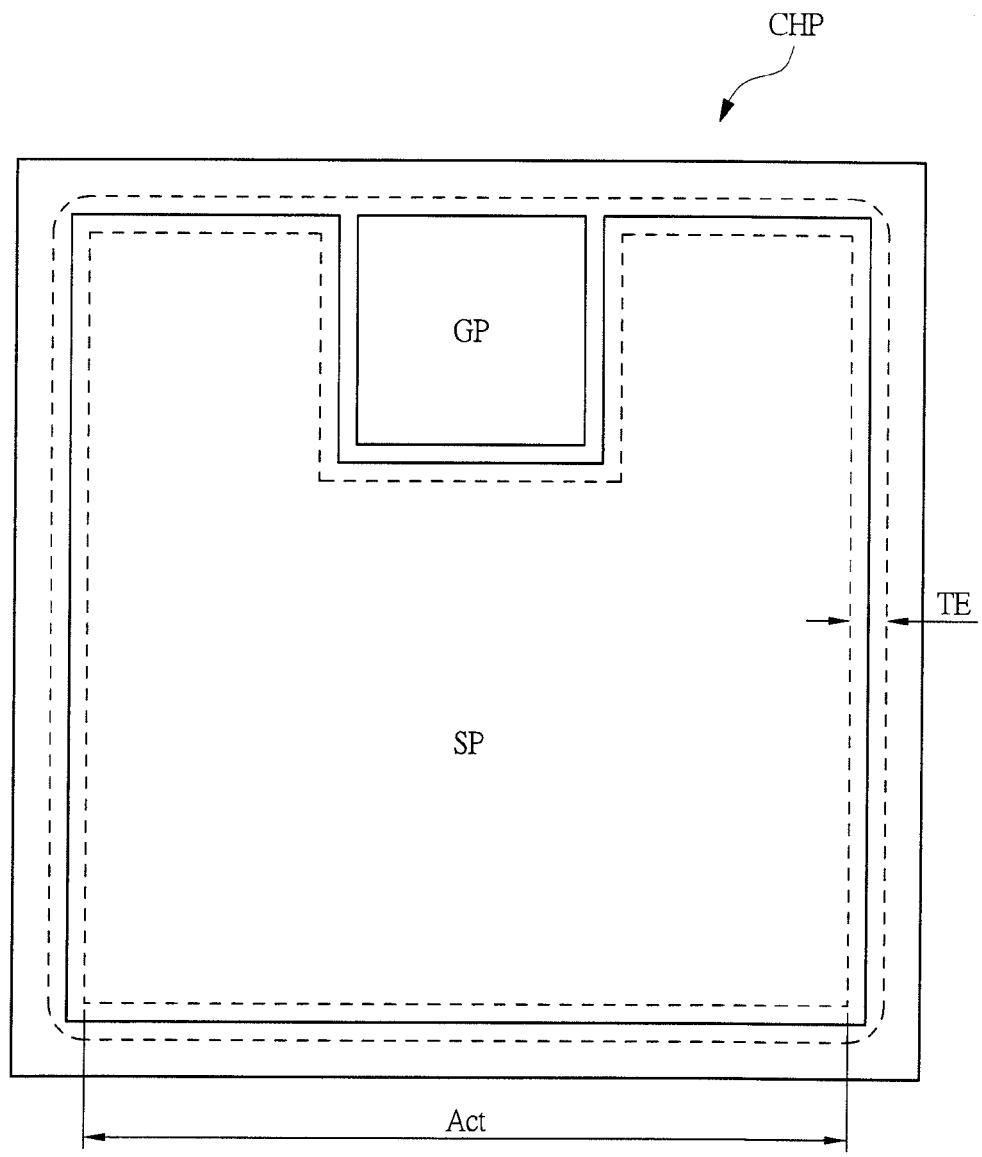
FIG. 1 is a plan view illustrating a structure of a semiconductor chip according to a first embodiment of the present invention.

FIG. 1 is a plan view illustrating a semiconductor chip CHP according to a first embodiment. As illustrated in FIG. 1, the semiconductor chip CHP in the first embodiment has a rectangular shape, and a termination region TE is formed so as to surround a peripheral portion of the semiconductor chip CHP. The termination region TE is a formed region in order to ease an electric-field strength in the peripheral portion of the semiconductor chip CHP. An active region Act is formed inside the semiconductor chip CHP surrounded by the termination region TE, and a plurality of junction field effect transistors (FETs) are formed in the active region Act. In the active region Act, a source pad SP electrically connected to a source region of the junction FET and a gate pad GP electrically connected to a gate region of the junction FET are formed. Note that, although not illustrated in FIG. 1, a rear surface of the semiconductor chip CHP becomes a drain pad. Thus, the source pad SP, the gate pad GP, and the drain pad are formed in the semiconductor chip CHP, so that the plurality of junction FETs formed in the active region Act can be operated by applying electrical signals from outside to these terminals.

Next, a structure of a junction FET formed in the active region Act is described. First, a structure of a junction FET in a comparison example is described and a problem of the same is described, and then, a structure of a junction FET in the first embodiment solving the problem is described.

Figure 2:
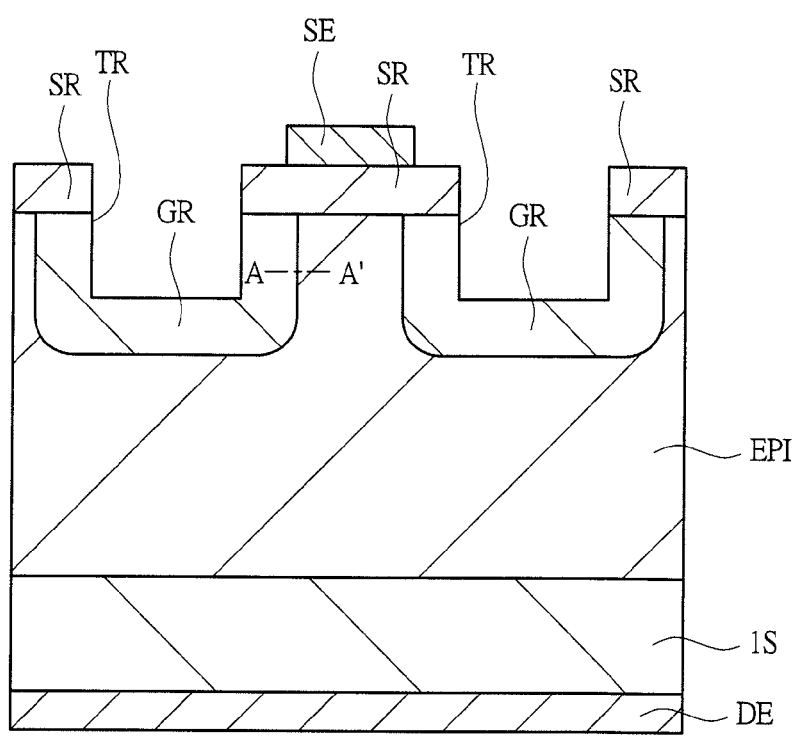
FIG. 2 is a cross-sectional view illustrating a structure of a junction FET in a comparison example studied by the present inventors.

FIG. 2 is a cross-sectional view illustrating the structure of the junction FET in the comparison example. As illustrated in FIG. 2, an epitaxial layer EPI to be a drift region is formed on a substrate 1S to be a drain region. the substrate 1S to be the drain region and the epitaxial layer EPI to be the drift region are each formed of a silicon carbide layer, and each has a semiconductor region in which an n-type impurity is doped to the silicon carbide layer. Here, an impurity concentration of the n-type impurity doped in the epitaxial layer EPI is lower than that of the n-type impurity doped in the substrate 1S.

And, a plurality of trenches TR each reaching an inside of the epitaxial layer EPI from a surface of the epitaxial layer EPI are formed, and a source region SR is formed in a surface region of the epitaxial layer EPI interposed between the trenches TR adjacent to each other. The source region SR is formed of the semiconductor region in which the n-type impurity is doped to the silicon carbide layer. On this source region SR, a source electrode SE electrically connected to the source region SR is formed.

A gate region GR is formed in the epitaxial layer EPI in contact with side walls (side surfaces) and a bottom surface of each of the plurality of trenches TR. The gate region GR is formed of a semiconductor region in which a p-type impurity is doped to the silicon carbide layer. And, the epitaxial layer EPI interposed between the gate regions GR adjacent to each other functions as the channel-formed region. That is, a p-n junction is formed at an interface between the channel-formed region formed of the n-type semiconductor region and the gate region GR formed of the p-type semiconductor region. Note that a drain electrode DE is formed on the rear surface of the substrate is.

Figure 3:
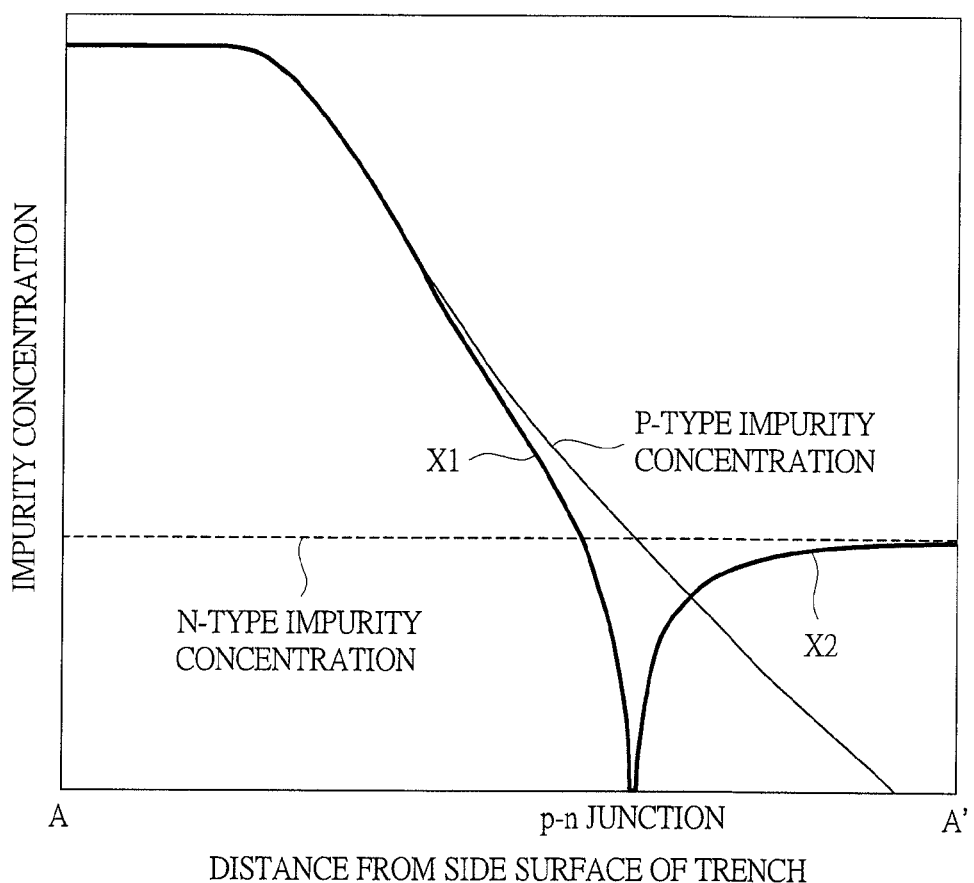
FIG. 3 is a graph illustrating an impurity profile taken along the line A-A' in FIG. 2.

The junction FET in the comparison example is configured as described above, and the junction FET of the normally-OFF type using silicon carbide has the gate region GR formed by ion implantation. Therefore, a gradual p-n junction is formed between the gate region GR and the channel-formed region. FIG. 3 is a graph illustrating an impurity concentration taken along the line A-A' in FIG. 2. A point A side in FIG. 3 indicates the gate region GR to which the p-type impurity is doped with high concentration. On the other hand, a point A' side in FIG. 3 indicates the channel-formed region (epitaxial layer EPI) to which the n-type impurity is doped. And, the p-n junction is formed between the gate region GR and the channel-formed region. In FIG. 3, a curve X1 indicates a net concentration distribution of the impurity from the gate region GR to the p-n junction, and a curve X2 indicates a net concentration distribution of the impurity from the p-n junction to the channel-formed region. As illustrated in FIG. 3, it is found that a slope of the curve X1 in a vicinity of the p-n junction is gradually tailed. This corresponds to the gradual p-n junction between the gate region GR and the channel-formed region.

In this manner, a reason for this gradual p-n junction between the gate region GR and the channel-formed region is as follows. That is, since impurities hardly diffuse in silicon carbide, high-energy ion implantation is required in order to form a box profile. In the gradual p-n junction, a potential in the vicinity of the p-n junction is easy to be influenced by a drain bias in a blocking state, and therefore, this causes decrease of blocking voltage. In order to improve the blocking voltage, the channel has to be narrowed, and as a result, current volume in an ON state is decreased. That is, ON resistance is increased. Accordingly, in the junction FET of the comparison example, it is difficult to achieve both of ensuring the blocking voltage and decreasing the ON resistance.

Accordingly, in the first embodiment, the structure of the junction FET is devised to solve the above-described problem. Hereinafter, the structure of the junction FET in the first embodiment is described.

Figure 4:
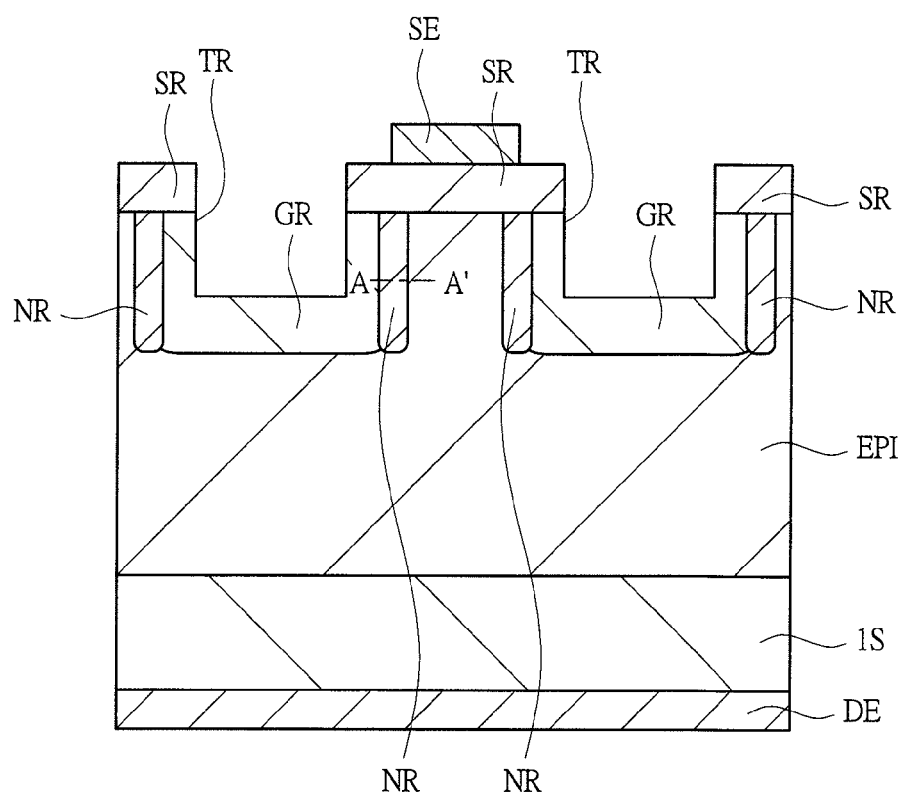
FIG. 4 is a cross-sectional view illustrating a structure of a junction FET according to the first embodiment.

FIG. 4 is a cross-sectional view of the structure of the junction FET in the first embodiment. As illustrated in FIG. 4, an epitaxial layer EPI to be a drift region is formed on a substrate 1S to be a drain region. The substrate 1S to be the drain region and the epitaxial layer EPI to be the drift region are each formed of a silicon carbide layer, and each has a semiconductor region in which an n-type impurity is doped to the silicon carbide layer. Here, an impurity concentration of the n-type impurity doped in the epitaxial layer EPI is lower than that of the n-type impurity doped in the substrate 1S.

And, a plurality of trenches TR each reaching an inside of the epitaxial layer EPI from a surface of the epitaxial layer EPI are formed, and a source region SR is formed in a surface region of the epitaxial layer EPI interposed between the trenches TR adjacent to each other. The source region SR is formed of a semiconductor region in which the n-type impurity is doped to the silicon carbide layer. On this source region SR, a source electrode SE electrically connected to the source region SR is formed.

A gate region GR is formed in the epitaxial layer EPI in contact with side walls (side surfaces) and a bottom surface of each of the plurality of trenches TR. The gate region GR is formed of a semiconductor region in which the p-type impurity is doped to the silicon carbide layer. And, the epitaxial layer EPI interposed between the gate regions GR adjacent to each other functions as the channel-formed region. That is, a p-n junction is formed at an interface between the channel-formed region formed of the n-type semiconductor region and the gate region GR formed of the p-type semiconductor region.

And, a drain electrode DE is formed on a rear surface of the substrate 1S. Further, although not illustrated, a multi-layer (for example, double-layer) wiring of, for example, aluminum wiring is formed via an interlayer insulating film on the surface of the epitaxial layer EPI on which the trenches TR and the source electrode SE are formed. The source electrode SE is connected to a source pad, the gate region GR is connected to a gate electrode, and the gate electrode is electrically connected to a gate pad. On the other hand, the drain electrode DE formed on the rear surface of the substrate 1S is connected to a drain pad.

Here, in the first embodiment, an n-type region NR to which an n-type impurity is doped is formed in a vicinity of the p-n junction between the gate region GR formed on the side walls of the trench TR and the channel-formed region interposed between the gate regions GR adjacent to each other. In this manner, a point of forming the n-type region NR is one of features in the first embodiment.

An impurity concentration of the n-type region NR is higher than that of the epitaxial layer EPI. Further, when the n-type region NR is assumed as a part of the channel-formed region interposed between the gate regions GR adjacent to each other, the formation of the n-type region NR in the vicinity of the p-n junction in the channel-formed region interposed between the gate regions GR adjacent to each other means that the impurity concentration of the junction region forming the p-n junction with the gate region GR in the channel-formed region is higher than those of a center region of the channel-formed region and the epitaxial layer EPI.

In the first embodiment, by forming the n-type region NR, the impurity profile in the vicinity of the p-n junction formed between the gate region GR and the channel-formed region is changed. That is, the n-type region NR which is a featured structure in the first embodiment is formed to change the impurity profile in the vicinity of the p-n junction formed between the gate region GR and the channel-formed region. Hereinafter, the change of the impurity profile in the vicinity of the p-n junction by forming the n-type region NR between the gate region GR and the channel-formed region is described with reference to FIG. 5.

Figure 5:
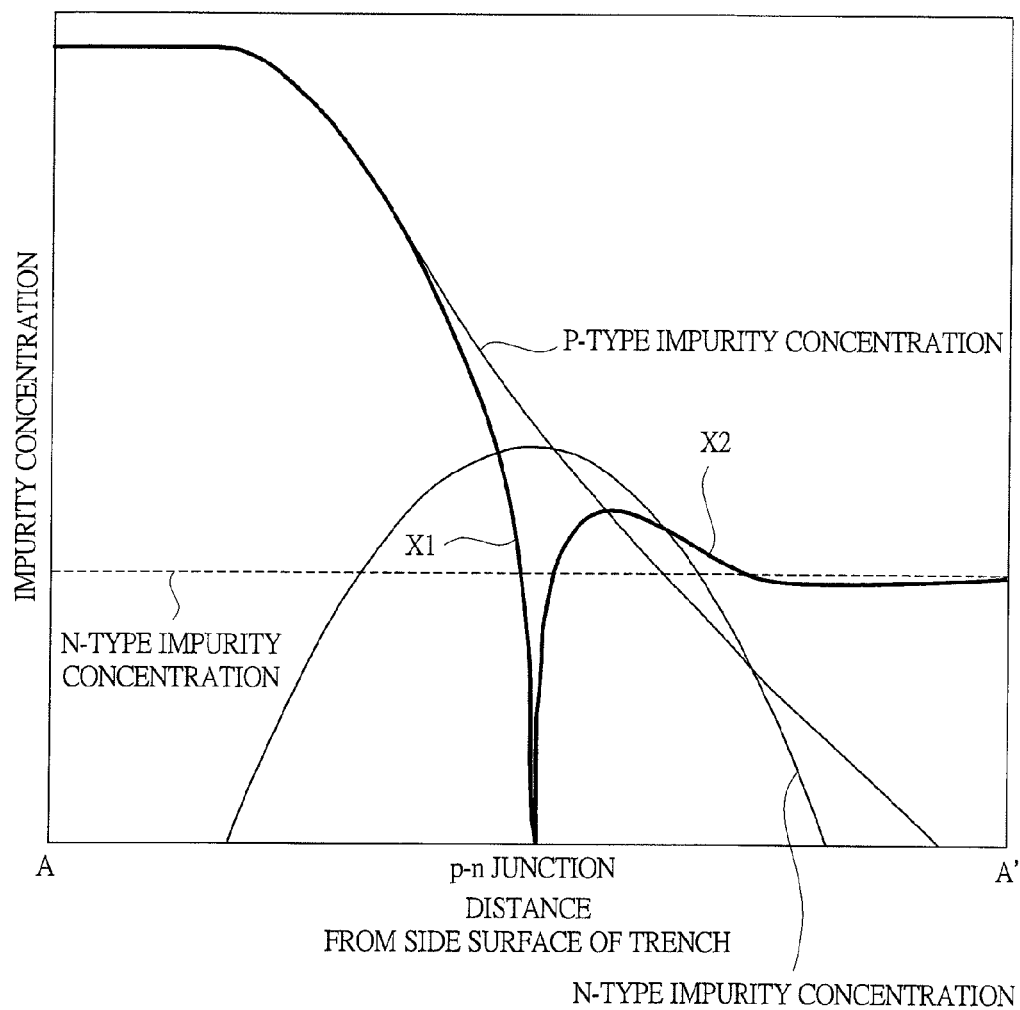
FIG. 5 is a graph illustrating an impurity profile taken along the line A-A' in FIG. 4.

FIG. 5 is a graph illustrating the impurity concentration taken along the line A-A' in FIG. 4. A point "A" side in FIG. 5 indicates the gate region GR to which the p-type impurity is doped with high concentration. On the other hand, a point "A'" side in FIG. 5 indicates the channel-formed region (epitaxial layer EPI) to which the n-type impurity is doped. And, the p-n junction is formed between the gate region GR and the channel-formed region. Here, in the first embodiment, since the n-type region NR is formed in the vicinity of the p-n junction, the n-type impurity is doped with high concentration in the vicinity of the p-n junction as illustrated in FIG. 5. More specifically, in FIG. 5, the n-type impurity is doped with a concentration represented by an upward-convex parabolic shape peaking at a position of the p-n junction. Here, a curve X1 indicates a net concentration distribution of the impurity from the gate region GR to the p-n junction, and a curve X2 indicates a net concentration distribution of the impurity from the p-n junction to the channel-formed region. As illustrated in FIG. 5, it is found that a slope of the curve X1 in the vicinity of the p-n junction is abrupt compared with that of FIG. 3, and further, the curve X2 in the vicinity of the p-n junction swells. This can be interpreted as follows. When considering the curve X1, the low-concentration gate region GR (tail region) formed so as to tail in the vicinity of the p-n junction is cancelled by the formation of the n-type region NR, and as a result, the net impurity concentration in the vicinity of the p-n junction becomes abrupt. On the other hand, when considering the curve X2, an n-type impurity with high concentration is doped also to the vicinity of the p-n junction on the channel-formed region side, and as a result, the impurity concentration of the p-n junction on the channel-formed region side is increased. As described above, in the first embodiment, by the formation of the n-type region NR between the gate region GR and the channel-formed region, the impurity profile of the p-n junction formed between the gate region GR and the channel-formed region can be abrupt, and also the impurity concentration of the p-n junction on the channel-formed region side can be increased. As a result, according to the first embodiment, the potential in the vicinity of the p-n junction can be difficult to be influenced by the drain bias in the blocking state, so that the blocking voltage can be improved, and further, the ON resistance can be decreased.

Hereinafter, descriptions are made to the fact that, according to the junction FET in the first embodiment, the potential in the vicinity of the p-n junction can be difficult to be influenced by a drain bias in a blocking state, and as a result, the blocking voltage can be improved and the ON resistance can be decreased. First, the descriptions are made with descriptions of an operation of the junction FET in the first embodiment, and then, are made with reference to band diagrams in detail.

The junction FET in the first embodiment is configured as described above, and the operation of the junction FET is subsequently described. The blocking state (OFF state of the junction FET) is described here. In the blocking state, with applying 0 V or a negative voltage to the gate region GR, a voltage of 100V to several kV is applied to the drain region (drain electrode DE). At this time, the depletion layer from the p-n junction formed between the channel-formed region and the gate region GR extends over the entire channel-formed region. Therefore, the source region SR is shielded (blocked) from the drain region (substrate 1S) by the depleted channel-formed region, so that the junction FET is turned off. At this time, an energy barrier is formed between the source region SR and the channel-formed region. A height of the energy barrier is decreased by the influence of a drain electric field from the drain region. Therefore, as an original energy barrier is higher and the decrease of the energy barrier due to the drain electric field is smaller, the blocking voltage is improved. In the first embodiment, by forming the n-type region NR, the impurity profile of the p-n junction between the gate region GR and the channel-formed region becomes abrupt, and also the n-type impurity concentration of the p-n junction on the channel-formed region side is increased. Both of the abrupt impurity profile and the increase of the n-type impurity concentration have an effect of narrowing the low-concentration impurity region of the p-n junction easily influenced by the drain electric field, so that it is possible to suppress the decrease of the energy barrier in the OFF state in which the high voltage is applied to the drain region. As a result, according to the first embodiment, the blocking voltage can be improved.

Meanwhile, an ON state of the junction FET is considered here. In the ON state of the junction FET, a voltage of about 2.5 V is applied to the gate region GR, and a voltage of about 1 to 2 V is applied to the drain region (substrate 1S and drain electrode DE). In this manner, the depletion layer between the gate region GR and the channel-formed region is narrowed to form a channel, which is a carrier path, at the center portion of the channel-formed region. Therefore, the source region SR and the drain region are electrically connected to each other via the channel, so that carriers flow from the source region SR toward the drain region via the channel with the voltage applied to the drain region. At this time, as the energy barrier between the source region SR and the channel-formed region is lower when no voltage is applied to the gate region GR, a gate voltage at which a drain current starts to flow, that is, a threshold voltage, is decreased, and an ON current is increased (ON resistance is decreased). In the first embodiment, the decrease of the energy barrier with applying the voltage to the drain region is small at the OFF time, and therefore, the blocking voltage is improved even if the original energy barrier is lowered. Therefore, for example, when the same blocking voltage is ensured in the junction FETs of the first embodiment and the comparison example, the original energy barrier of the junction FET in the first embodiment is lower than that in the comparison example, and as a result, the threshold voltage at the ON time can be decreased, so that the ON current can be increased. More particularly, in the junction FET of the normally-off type, the channel width is narrow, and therefore, the decrease of the ON resistance is remarkable. Thus, according to the junction FET in the first embodiment, it is possible to achieve both of improving the blocking voltage and decreasing the ON resistance.

Further, descriptions are made with reference to band diagrams to the fact that, according to the structure of the junction FET in the present embodiment, the potential in the vicinity of the p-n junction can be difficult to be influenced by the drain bias in the blocking state, and as a result, the blocking voltage can be improved and the ON resistance can be decreased.

Figure 6:
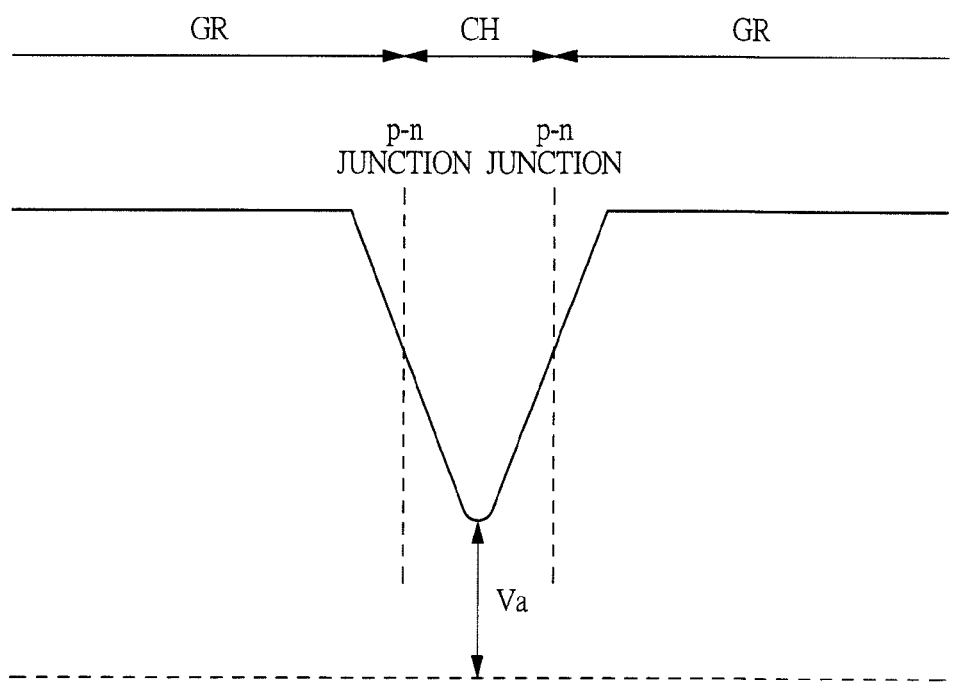
FIG. 6 is a schematic diagram illustrating a band structure between a gate region and a channel-formed region in the comparison example.

FIG. 6 is a diagram illustrating a band structure between the adjacent gate regions GR and the channel-formed region CH interposed between the adjacent gate regions GR in the comparison example. In FIG. 6, it is found that the band slopes at each interface between the gate region GR and the channel-formed region to form the depletion layer. Also, FIG. 6 illustrates, in the channel-formed region CH, an energy barrier Va between a bottom portion of a band forming the depletion layer and a non-depleted conductive band. The junction FET is OFF when the energy barrier Va exists, and the junction FET is ON when the energy barrier Va disappears.

Figure 7:
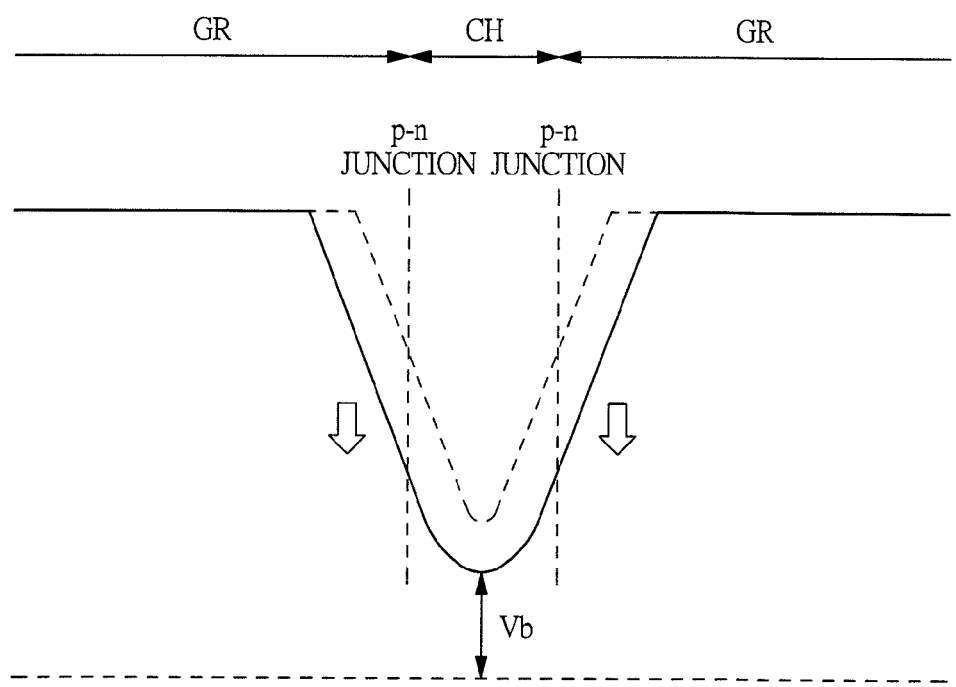
FIG. 7 is a schematic diagram illustrating a state in which the band structure is changed by influences of a drain bias in the comparison example.

Here, the energy barrier Va illustrated in FIG. 6 shows when the influence of the drain bias (voltage applied to the drain region) at the OFF time is not considered. However, the energy barrier Va is practically decreased by the influence of the drain bias. FIG. 7 illustrates a band diagram when the influence of the drain bias based on the state as illustrated in FIG. 6 is considered. As illustrated in FIG. 7, the energy barrier Va is practically decreased to an energy barrier Vb by the influence of the drain bias at the OFF time. At this time, in the comparison example illustrated in FIGS. 6 and 7, the p-n junction formed between the gate region GR and the channel-formed region is gradual. That is, the gradual p-n junction means that the low-concentration impurity region in the vicinity of the p-n junction exists as tailing. This means that, since the depletion layer extends in the low-concentration impurity region longer than the high-concentration impurity region, the depletion layer from the p-n junction extends also to the gate region GR side. The extension is represented by an extension of the sloped region of the band indicating the depletion layer from the p-n junction to the gate region GR side in FIGS. 6 and 7. When the drain bias is applied in this state, the decrease of the energy barrier due to the drain bias becomes more remarkable by the extension of the low-concentration impurity region to the gate region GR. As a result, the blocking voltage is decreased by the decrease of the energy barrier from the energy barrier Va to the energy barrier Vb, and therefore, a leak current is increased. Thus, in the junction FET in the comparison example, the decrease of the blocking voltage is a problem. That is, in order to ensure a certain blocking voltage (for example, blocking voltage corresponding to the energy barrier Va), in anticipation of a large decrease of the energy barrier due to the drain bias, the energy barrier at the OFF time has to be set sufficiently higher than the energy barrier Va. This means that the threshold voltage at the ON time is increased, and therefore, the ON resistance is increased. That is, in the junction FET in the comparison example, it is difficult to achieve both of improving the blocking voltage and decreasing the ON resistance.

Figure 8:
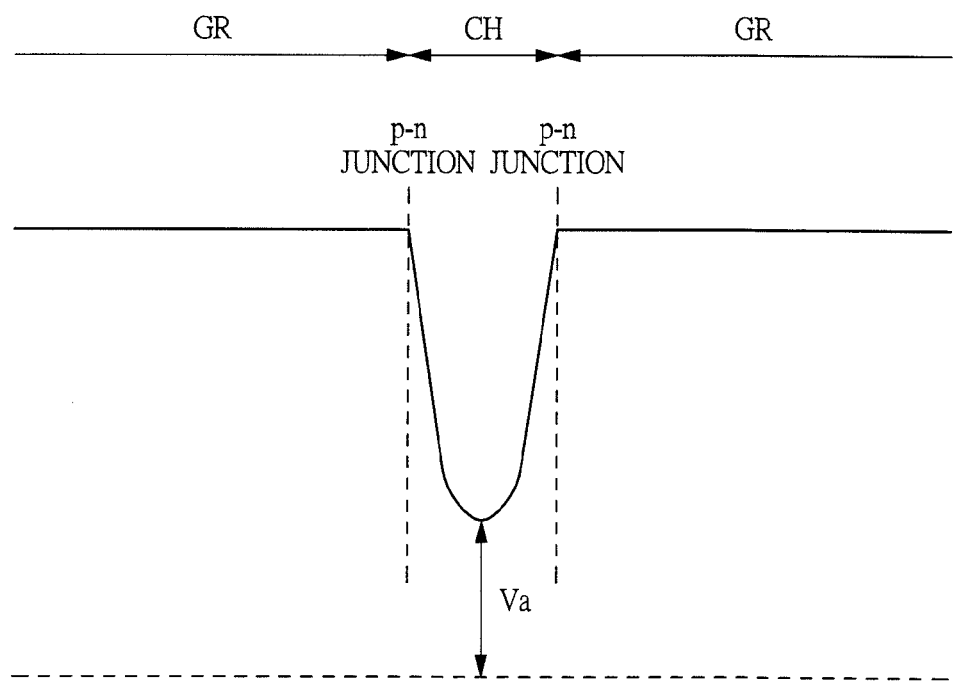
FIG. 8 is a schematic diagram illustrating a band structure between a gate region and a channel-formed region in the first embodiment.

Next, FIG. 8 is a diagram illustrating a band structure between the adjacent gate regions GR and the channel-formed region CH interposed between the adjacent gate regions GR in the present embodiment. In FIG. 8, it is found that the band is sloped at each interface between the gate region GR and the channel-formed region to form the depletion layer. And, FIG. 8 illustrates, in the channel-formed region CH, an energy barrier Va between a bottom portion of the band forming the depletion layer and a non-depleted conductive band. The junction FET is OFF when the energy barrier Va exists, and the junction FET is ON when the energy barrier Va disappears.

Here, FIGS. 8 and 6 are different in the following point. Compared with the significant extension of the depletion layer on the gate region GR side of the p-n junction in FIG. 6 illustrating the comparison example, the depletion layer hardly extends on the gate region GR side of the p-n junction in FIG. 8 illustrating the first embodiment. This is because the impurity profile of the p-n junction formed between the gate region GR and the channel-formed region CH is abrupt, and therefore, the low-concentration impurity region in the vicinity of the p-n junction disappears to form the high-concentration impurity region. That is, in FIG. 8, since the low-concentration impurity region hardly exists on the gate region GR side of the p-n junction to form the high-concentration impurity region, the depletion layer does not extend to each gate region GR. As a result, as illustrated in FIG. 8, the band-sloped region (corresponding to the depletion layer) is decreased on the gate region GR side of the p-n junction.

Further, the low-concentration impurity region becomes the high-concentration impurity region even on the channel-formed region side in the vicinity of the p-n junction. This corresponds to the abrupt slope of the band in FIG. 8. That is, in the first embodiment, the n-type region is formed in the vicinity of the p-n junction, and as a result, the low-concentration impurity region becomes the high-concentration impurity region even on the channel-formed region side in the vicinity of the p-n junction.

Figure 9:
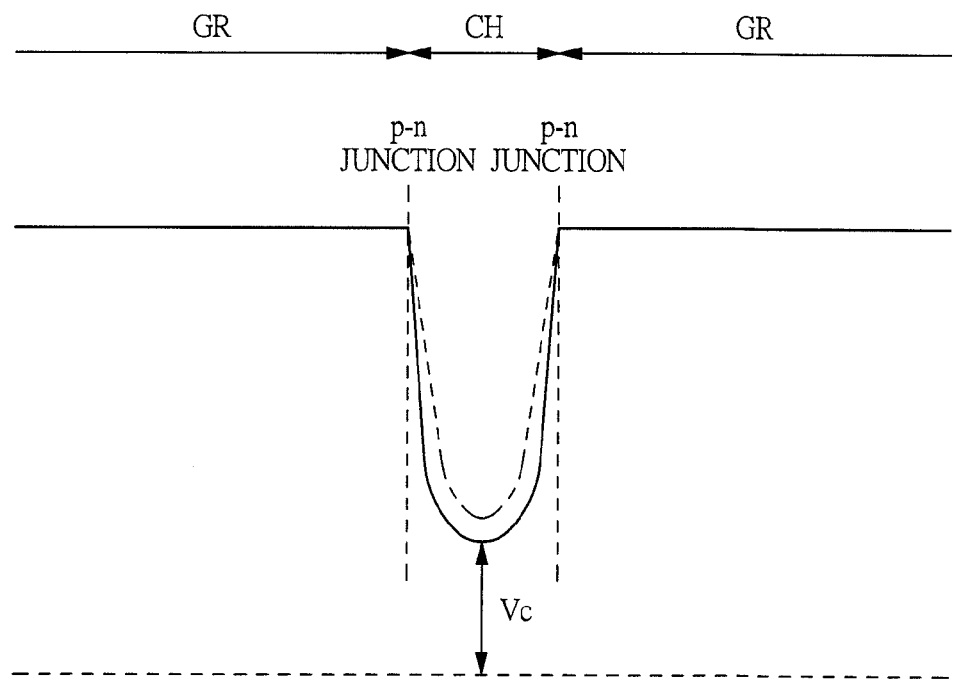
FIG. 9 is a schematic diagram illustrating a state in which the band structure is changed by influences of a drain bias in the first embodiment.

Here, the energy barrier Va illustrated in FIG. 8 shows when an influence of a drain bias (voltage applied to the drain region) at the OFF time is not considered. However, also in the first embodiment, the energy barrier Va is practically decreased by the influence of the drain bias. FIG. 9 is a band diagram when the influence of the drain bias based on the state as illustrated in FIG. 8 is considered. As illustrated in FIG. 9, the energy barrier Va is practically decreased to an energy barrier Vc by the influence of the drain bias at the OFF time. At this time, in the comparison example illustrated in FIGS. 8 and 9, since the n-type impurity is doped to the vicinity of the p-n junction, the low-concentration impurity region is decreased, and therefore, the p-n junction formed between the gate region GR and the channel-formed region becomes abrupt. That is, the abrupt p-n junction means that the low-concentration impurity region in the vicinity of the p-n junction is decreased. This means that, since the depletion layer extends in the low-concentration impurity region longer than the high-concentration impurity region, the depletion layer from the p-n junction does not extend so much to the gate region GR side in the first embodiment. This is represented by the sloped region of the band indicating the depletion layer not extending so much from the p-n junction to the gate region GR side in FIGS. 8 and 9. Further, the low-concentration impurity region on the channel-formed region side of the p-n junction also becomes the high-concentration impurity region. When the drain bias is applied in this state, the decrease of the energy barrier due to the drain bias becomes small by the almost no-extension of the low-concentration impurity region to the gate region GR. Still further, since the impurity concentration in the vicinity of the p-n junction on the channel-formed region side is increased (corresponding to the abrupt slope of the band), the decrease of the energy barrier due to the drain bias becomes small.

As a result, the energy barrier is decreased from the energy barrier Va to the energy barrier Vc even in the first embodiment. However, the energy barrier Vc is higher than the energy barrier Vb in the comparison example. This means that the decrease of the energy barrier due to the drain bias in the first embodiment is smaller than that of the comparison example. Therefore, the blocking voltage of the junction FET in the first embodiment can be improved more than that in the comparison example. That is, to ensure a certain blocking voltage (for example, blocking voltage corresponding to the energy barrier Va), the energy barrier at the OFF time has to be set higher than the energy barrier Va in anticipation of the decrease of the energy barrier due to the drain bias. However, in the first embodiment, an offset amount for ensuring a certain blocking voltage can be decreased compared with the comparison example. This means that the threshold voltage at the ON time is decreased in the first embodiment compared with the comparison example, and therefore, the ON resistance can be decreased. That is, in the junction FET in the first embodiment, it is possible to achieve both of improving the blocking voltage and decreasing the ON resistance compared with the comparison example.

In the junction FET in the first embodiment, a blocking voltage level of about 600 V is assumed. Therefore, for example, in FIG. 4, the epitaxial layer EPI (drift layer) has an impurity concentration of $2 \times 10^{16}$ cm$^{-3}$ and a thickness of 6 μm, and the trench TR has a depth of 1.2 μm and a width of 1 μm. Since a width of the source region SR directly relates to device characteristics (particularly, threshold voltage), the width is set in a range of about 0.8 to 1.0 μm. The gate region GR is, for example, a p-type region containing aluminum as impurities and its peak concentration is about $10^{19}$ cm$^{-3}$. The n-type region NR is, for example, a semiconductor region containing nitrogen as impurities and its peak concentration is desirably about half to one order of magnitude higher than a substrate concentration of the substrate 1S. This is to effectively increase the impurity concentration of a part of the channel-formed region. In the channel-formed region forming the p-n junction with each gate region GR, the peak concentration in the vicinity of the p-n junction is desirably about twice to five times higher than the original impurity concentration of the epitaxial layer or the impurity concentration of the center portion of the channel-formed region. This is because, if the peak concentration in the vicinity of the p-n junction of the channel-formed region is increased too much, the blocking voltage decreases unless the width of the channel-formed region is narrowed. Here, narrowing the width of the channel-formed region means that the width easily receives an influence of variations in dimension, and the variations in dimension increase variations in device characteristics. Thus, it is desirable not to increase too much the peak concentration in the vicinity of the p-n junction of the channel-formed region. On the other hand, setting the peak concentration in the vicinity of the p-n junction of the channel-formed region to be twice or more is because the potential in the vicinity of the p-n junction is difficult to be influenced by the drain bias in the blocking state. However, even if the peak concentration in the vicinity of the p-n junction of the channel-formed region is set to be less than twice, the impurity profile of the p-n junction formed between the gate region GR and the channel-formed region can be effectively abrupt as long as the peak concentration is higher than the original impurity concentration of the epitaxial layer or the impurity concentration of the center portion of the channel-formed region, so that the characteristics of the junction FET can be improved.

Figure 10:
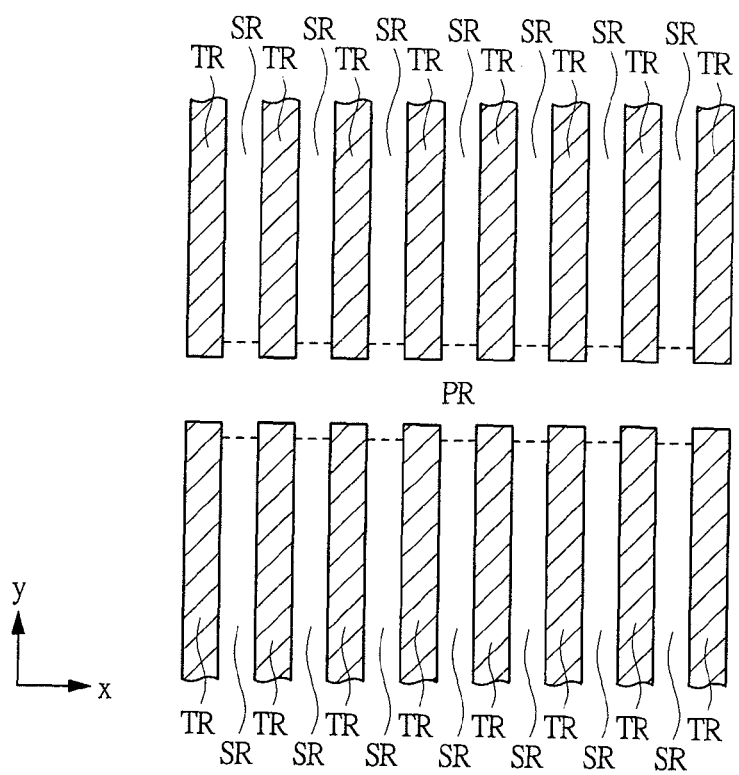
FIG. 10 is a diagram illustrating an example of a plane layout structure of the semiconductor device in the first embodiment.
Figure 11:
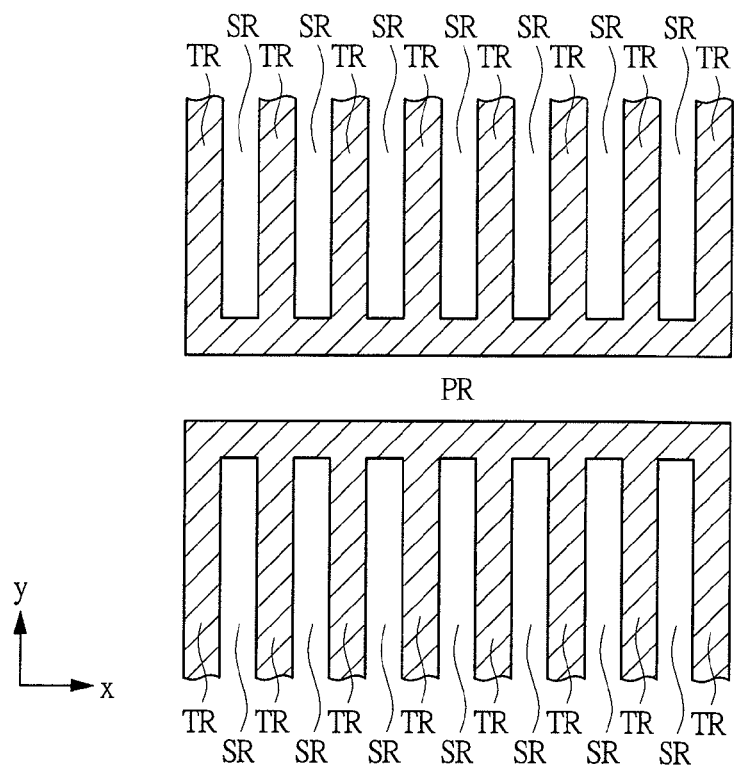
FIG. 11 is a diagram illustrating another example of the plane layout structure of the semiconductor device in the first embodiment.

Next, a planar layout structure of the junction FET in the first embodiment is described. FIGS. 10 and 11 are diagrams each illustrating an example of the planar layout structure of the junction FET in the first embodiment. In FIGS. 10 and 11, trenches TR are collaterally disposed along an x direction, and the source region SR is formed between adjacent trenches TR of the plurality of trenches TR. Here, in a point of view of increasing an area of the channel-formed region formed below the source region SR to decrease the ON resistance, the source region SR is desirably shaped to be not a square but a line whose one direction is longer than the other. And, a gate lead region PR is disposed, which is electrically connected to the gate region GR for leading, so as to divide the source regions extending in a y direction. By contacting the gate lead region PR with the gate wiring, the gate region formed on the side walls and bottom portion of the trench TR is electrically connected to the gate wiring (gate pad) via the gate lead region PR.

Two examples of the structures illustrated in FIGS. 10 and 11 can be thought as a termination portion of the trench TR. In this case, as illustrated in FIG. 10, it is desirable to provide a structure that each trench TR is shaped to be a rectangle and the trench TR is surrounded by the source regions SR and the gate lead region PR. This case is considered by a case that, for example, as illustrated in FIG. 11, each source region SR is shaped to be a rectangle and the source region SR is surrounded by the trenches TR. In this case, a shielding region by the source region SR does not exist at the termination portion of each trench TR extending in the x direction in FIG. 11, and therefore, a large amount of the n-type impurity is disadvantageously implanted to the bottom portion of the trench TR upon forming the n-type region NR (not illustrated in FIG. 11) on the bottom portion of the trench TR. That is, the n-type region NR (not illustrated in FIG. 11), which is a feature of the first embodiment, is formed by ion implantation from a tilt direction with respect to the trenches TR after forming the trenches TR. In this case, the n-type impurity is ion-implanted from a tilt-upward direction along the x direction in FIG. 11.

In this case, the source region SR is not formed at the termination portion (extending in the x direction in FIG. 11) of each trench TR illustrated in FIG. 11, and therefore, the large amount of the n-type impurity is doped to the bottom portion of each trench TR. Accordingly, the blocking voltage is decreased at the p-n junction (between the gate region and the epitaxial layer) formed on the bottom portion of the trench TR. However, when the gate region (p-type region) in the bottom portion of the trench TR is deeply formed, the layout structure as illustrated in FIG. 11 may be adopted.

Further, orientations (direction extending in the y direction in FIGS. 10 and 11) of the lines of the source regions SR and the trenches TR may be in any direction. However, when the orientations of the lines of the source regions SR and the trenches TR are disposed in parallel to a direction of an off angle (angle formed by a surface of the substrate and a lattice plane of the same) of the substrate, angles of tilted ion implantations from left and right to the lines of the source regions SR and the trenches TR become equivalent to each other. Therefore, the impurity profiles of the n-type region NR (not illustrated) formed on both sides (both ends) of the channel-formed region become equivalent to each other.

When lengths of the lines of the source regions SR and the trenches TR are too short, a channel area per device area becomes small, and the current becomes small. On the other hand, when the lengths of the lines of the source regions SR and the trenches TR are too long, the gate resistance becomes large, and a switching speed becomes slow. Therefore, the lengths of the lines of the source regions SR and the trenches TR are required to be selected as appropriate lengths.

Figure 12:
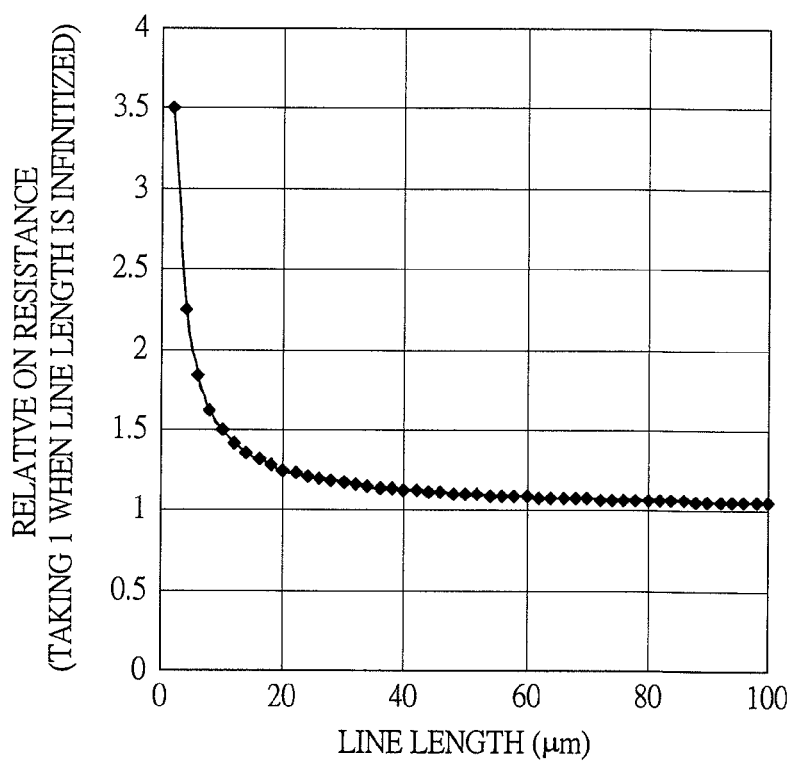
FIG. 12 is a graph illustrating a relation between a line length and a relative ON-resistance in the first embodiment.

FIG. 12 is a graph illustrating a relation between the length (line length) of the line of the source region and relative ON resistance per unit area. FIG. 12 illustrates a relative ON resistance with taking 1 when the line length is infinitized. As illustrated in FIG. 12, it is found that the relative ON resistance per unit area rapidly increases when the line length of the source region is shorter than 10 µm. Therefore, in a point of view of decreasing the relative ON resistance, the line length of the source region is desirably 10 µm or longer.

Figure 13:
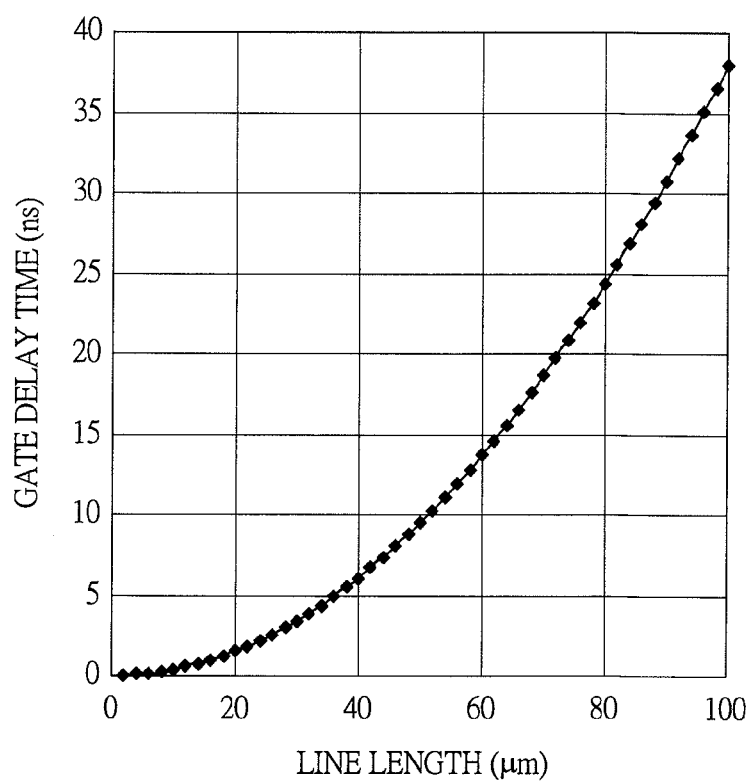
FIG. 13 is a graph illustrating a relation between the line length and a gate delay time in the first embodiment.

Meanwhile, FIG. 13 is a graph illustrating a relation between the length (line length) of the line of the trench and a gate delay time. As illustrated in FIG. 13, it is found that the gate delay time becomes longer as the line length of the trench becomes longer. Since the switching speed is reportedly slow when the gate delay time is 10 ns or longer, the line length of the trench is required to be selected so that the gate delay time is shorter than 10 ns. More specifically, the line length of the trench is desirably 50 µm or shorter so that the gate delay time is shorter than 10 ns. As described above, in consideration of decreasing the ON resistance and the gate delay time, the line lengths of the source region and trench is set to 20 µm in the first embodiment.

However, if the structure of the contact with the gate region at the bottom portion of the trench is adopted, the gate resistance of the gate region can be decreased (meaning that the gate delay time can be shortened), and therefore, the line lengths of the source region and trench can be increased to be 50 µm or longer in this case.

As the structure of the contact at the bottom portion of the trench, there are a structure in which a silicide region is formed at the bottom portion of the trench and a structure in which a plug reaching the bottom portion of the trench is formed for direct contact. The former is achieved by opening a contact hole at the bottom portion of the trench to form the silicide region and then embedding an insulating film inside the trench. The latter is achieved by opening a contact hole at the bottom portion of the trench, embedding a tungsten film or the like inside the trench to form an embedded plug. And, by removing a protruding tungsten film outside the trench through a chemical mechanical polishing (CMP) method, the latter can be achieved. Although the former is simple in manufacture process, the latter can decrease the gate resistance. Therefore, for high-speed switching, the latter structure is desirably selected.

Figure 14:
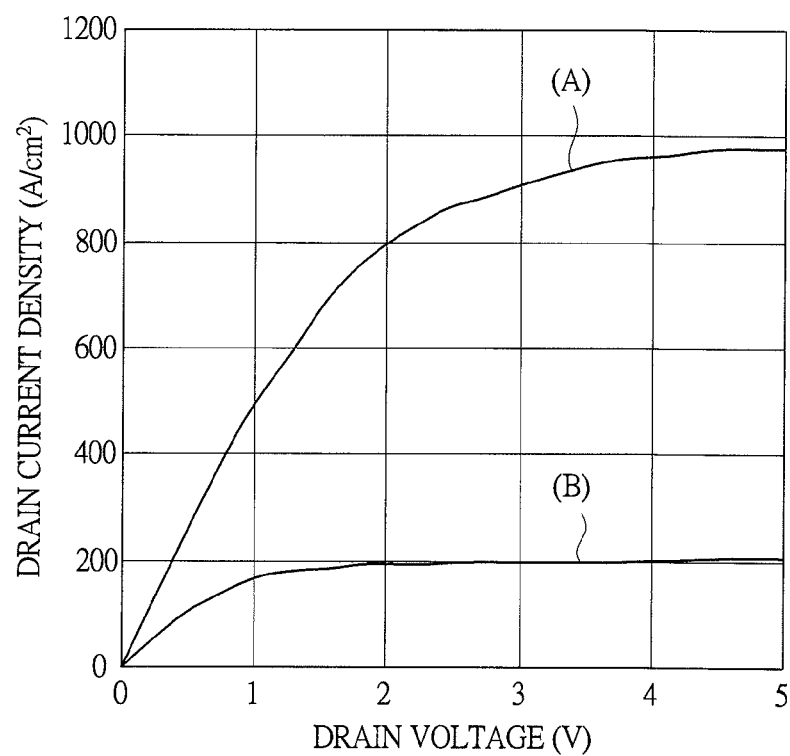
FIG. 14 is a graph illustrating a relation between a drain voltage and a drain current density in the first embodiment and the comparison example.

Subsequently, effects in the first embodiment are described with reference to the drawings. FIG. 14 is a graph illustrating a relation between a drain voltage of the junction FET and a drain current density of the same in the first embodiment (curve (A)) and a relation between a drain voltage of the junction FET and a drain current density of the same in the comparison example (curve (B)). In the junction FETs in the first embodiment and in the comparison example, both of their blocking voltages are 650 V, and their source regions are formed with a maximum source width capable of ensuring the blocking voltage. And, both of their gate voltages are set at 2.5 V, which is lower than or equal to the built-in potential of the p-n junction, so that a small number of carriers are not injected from the gate region. When FIG. 14 is viewed under these conditions, the junction FET (curve (A)) in the first embodiment has a current density about three times larger at a rated current (drain voltage of 1 V) and about five times larger at a saturated current than the junction FET (curve (B)) in the comparison example. Therefore, it is found that, according to the junction FET in the first embodiment, both of improvement of the blocking voltage and increase of the ON current (decrease of the ON resistance) can be achieved compared with the junction FET in the comparison example.

Next, the first embodiment has the feature of the formation of the n-type region in which the n-type impurity is doped to the vicinity of the p-n junction between the gate region formed on the side walls of the trench and the channel-formed region interposed between the adjacent gate regions, and a condition of the formation of the n-type region by ion implantation is described here. The condition of ion implantation includes an implant energy and a dose amount of an implant amount. First, the dose amount is changed with fixing the energy at 400 keV to study an influence on the device characteristics due to a difference in an impurity concentration in an end portion (n-type region) of the channel-formed region.

Figure 15:
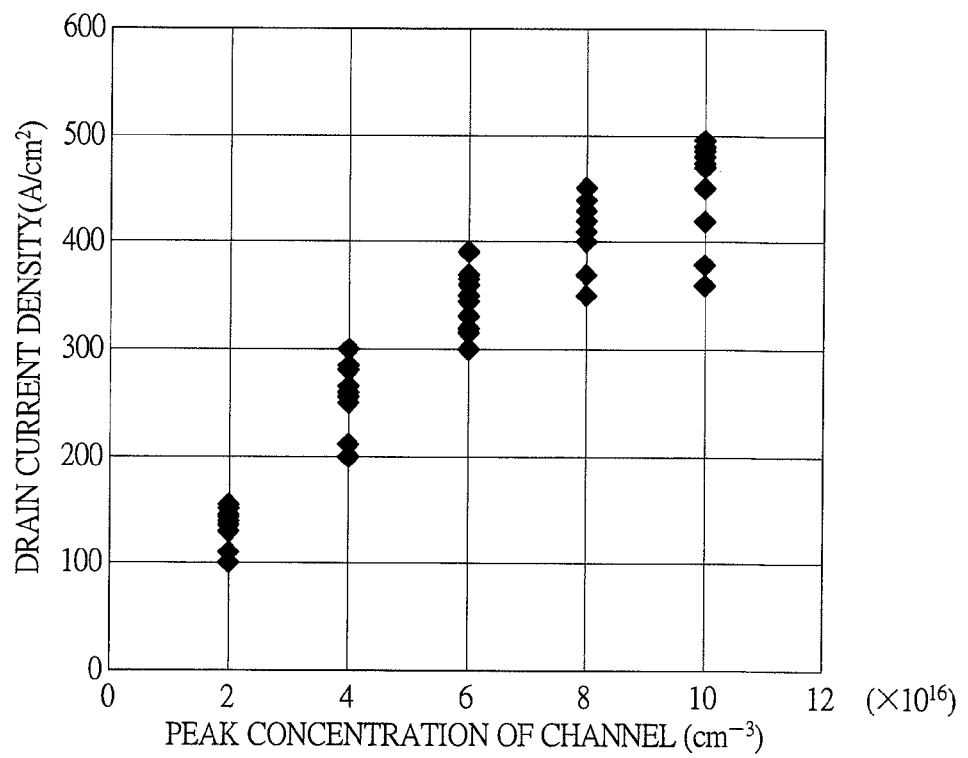
FIG. 15 is a graph illustrating a relation between a channel peak concentration and the drain current density.

FIG. 15 is a graph illustrating a relation between a peak concentration (channel peak concentration) of the channel-formed region and a drain current density. In FIG. 15, a horizontal axis represents the peak concentration of the channel-formed region, and a vertical axis represents the drain current density. As illustrated in FIG. 15, it is found that the drain current density becomes high as the peak concentration of the channel-formed region becomes high. Here, when the channel peak concentration becomes about $1 \times 10^{17}$ cm$^{-3}$, which is five times the concentration of the epitaxial layer, the drain current density tends to be saturated and its variation is large. A reason of this saturation tendency is described as follows. That is, although a reason of improving the drain current density is because of the decrease of the threshold voltage, the threshold voltage of the junction FET is already below 1 V when the peak concentration of the channel-formed region (peak concentration of the n-type region) is about $1 \times 10^{17}$ cm$^{-3}$, and therefore, it is difficult to further decrease the threshold voltage. On the other hand, a reason of the large variation is because, when the peak concentration of the channel-formed region is increased, the channel width capable of ensuring the blocking voltage is narrowed, and therefore, the device characteristics are significantly influenced by even a small dimensional shift. In consideration of the above descriptions, the peak concentration of the channel-formed region (peak concentration of the n-type region) is desirably about twice to five times the original impurity concentration of the epitaxial layer. In the first embodiment, the peak concentration is designed to be, for example, about $8 \times 10^{16}$ cm$^{-3}$, which is about four times the original impurity concentration.

Subsequently, even after the peak concentration is determined, there are still another ion implantation conditions. For example, even with any of a condition of about 300 keV (energy) and $1.2 \times 10^{13}$ cm$^{-2}$ (dose amount), a condition of about 400 keV (energy) and $6.0 \times 10^{12}$ cm$^{-2}$ (dose amount), and a condition of about 500 keV (energy) and $3.0 \times 10^{12}$ cm$^{-2}$ (dose amount), the peak concentration of the channel-formed region is almost the same. A difference among the conditions is that, in low energy and high dose amount, a large amount of the n-type impurity is doped to the vicinity of the p-n junction, and therefore, the concentration is particularly abrupt at the p-n junction. On the other hand, in high energy and low dose amount, the n-type impurity is deeply doped, and therefore, the concentration is increased even in a vicinity of the center portion of the channel-formed region.

Figure 16:
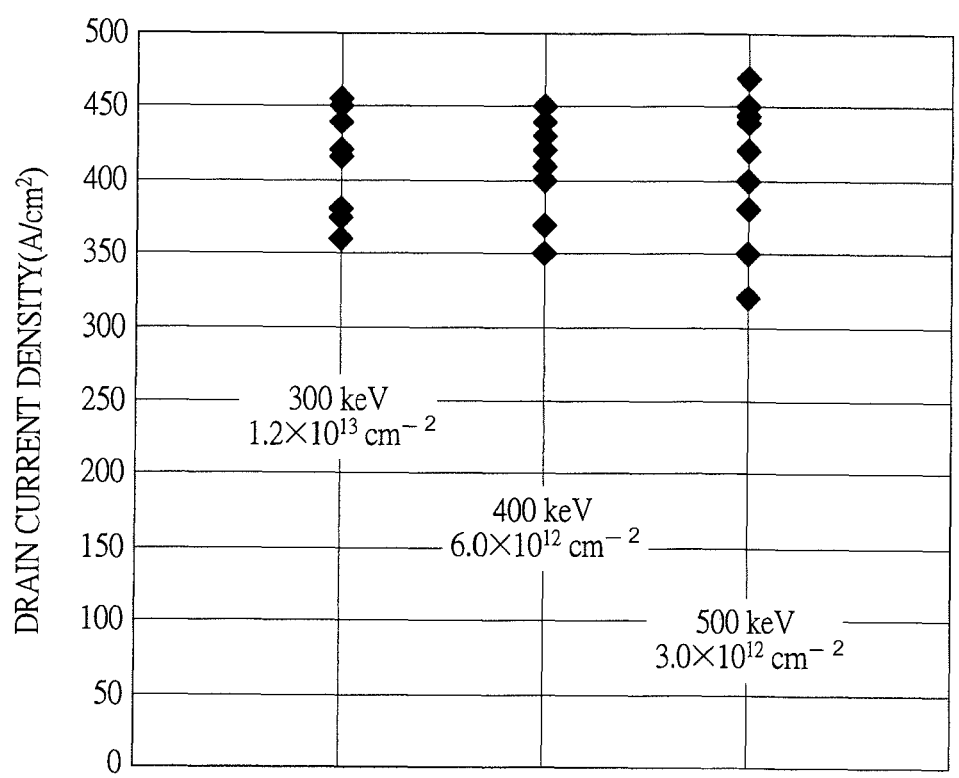
FIG. 16 is a graph illustrating a relation between an ion-implantation condition and the drain current density.

FIG. 16 illustrates drain current densities in three conditions of the ion implantation described above. As illustrated in FIG. 16, while average drain current densities in the three conditions are hardly changed, variations in the device characteristics in the condition of high energy and low dose amount are increased. This is because, when the impurity concentration of the center portion of the channel-formed region is increased, the channel width capable of ensuring the blocking voltage is narrowed, and therefore, the device characteristics are significantly influenced by even a small dimensional shift of the channel width similar to the case where the peak concentration of the channel-formed region is increased too much. In consideration of the above descriptions, in the first embodiment, the condition of about 400 keV (energy) and $6.0 \times 10^{12}$ cm$^{-2}$ (dose amount) is adopted as the ion implantation condition.

The junction FET in the first embodiment is configured as described above, and a method of fabricating this junction FET is described below with reference to the drawings.

Figure 17:
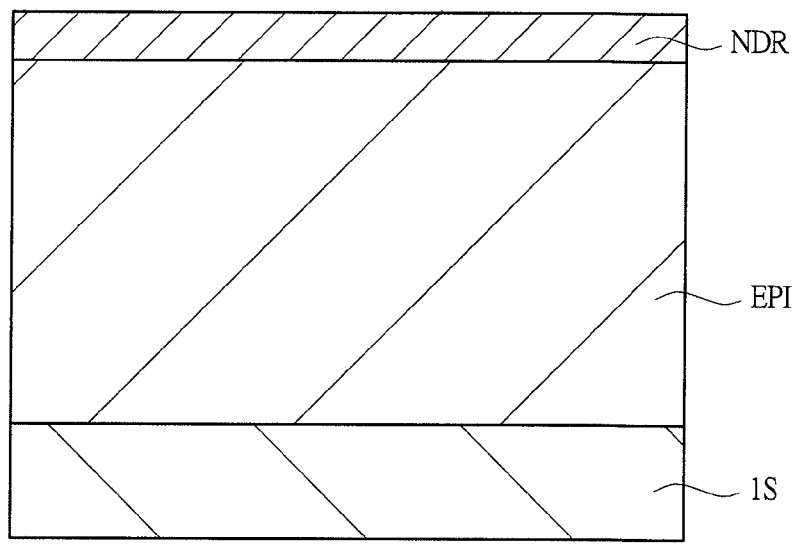
FIG. 17 is a cross-sectional view illustrating a step of manufacturing the semiconductor device in the first embodiment.

First, as illustrated in FIG. 17, the epitaxial layer EPI formed of an n-type region is grown on the substrate 1S. At this time, in a plane orientation of the substrate 1S, although an off angle is 8 degrees at a silicon plane (Si plane), the plane orientation may be a "C" plane or (11-20) plane, and the off angle may be 4 degrees or 0 degree. That is, they are not any problem as long as the epitaxial layer EPI is uniformly grown on the substrate 1S. Subsequently, after a silicon oxide film is deposited, the silicon oxide film is processed by using photolithography and dry etching techniques. Then, by an ion implantation method with the processed silicon oxide film as a hard mask, a p-type region to be a termination region is formed (not illustrated in FIG. 17). Ion species in the ion implantation method are aluminum and its concentration is about $1 \times 10^{17}$ cm$^{-3}$. Since the termination region has to be deeper than the gate region, a multi-stage implantation method with energy of 2 MeV is required in the ion implantation method. In the first embodiment, a JTE (junction termination extension) structure is adopted as the structure of the termination region. However, the structure of the termination region is not limited, and may be a guard ring structure, a mesa structure, or others.

Next, an n-type region NDR to be the source region and a gate-lead region (p-type region) (not illustrated in FIG. 17) to be a lead region of the gate region are formed on the epitaxial layer EPI by using the same method as the method of forming the termination region. Although the n-type region NDR is formed on the entire surface of the epitaxial layer EPI in FIG. 17, the gate-lead region and the termination region are also practically formed on the epitaxial layer EPI, and the n-type region NDR is not formed in the gate-lead region and the termination region. Ion species in the ion implantation method are nitrogen for the n-type region NDR, and are aluminum for the gate-lead region (p-type region). Note that, to ensure the gate blocking voltage, the ion implantation for forming the n-type region NDR is performed with heating the substrate 1S at 500° C.

Figure 18:
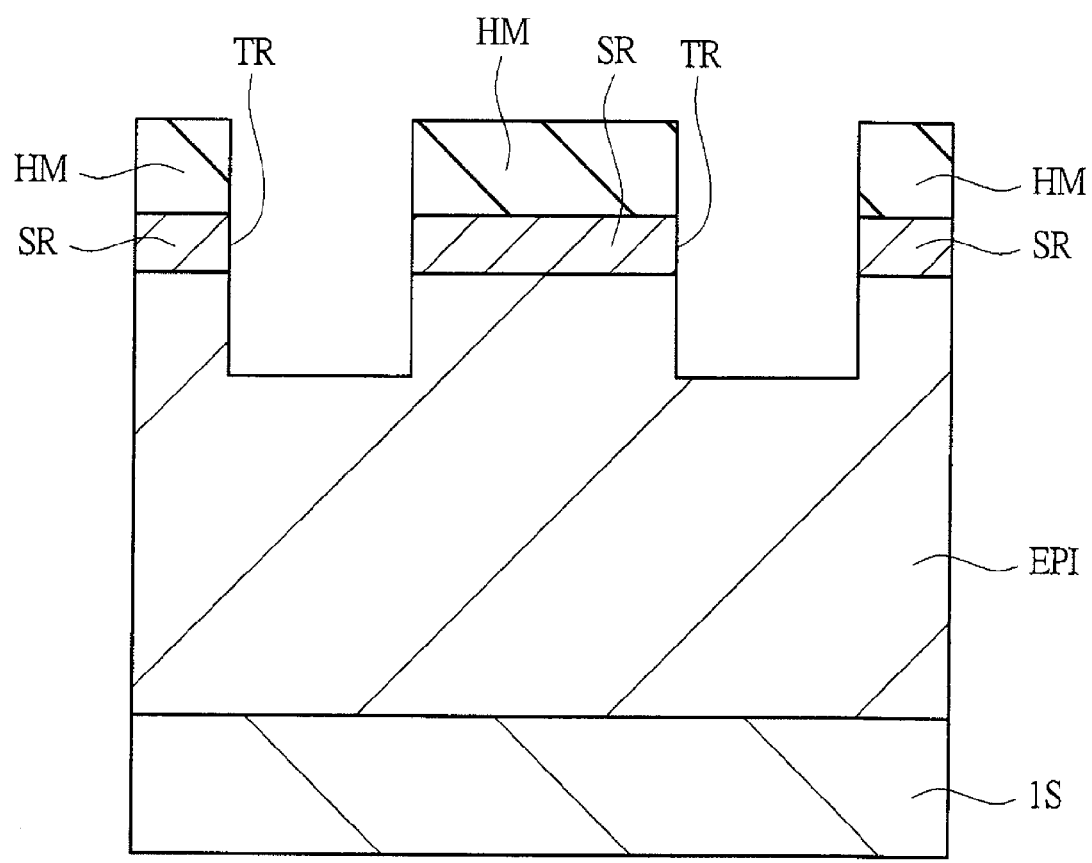
FIG. 18 is a cross-sectional view illustrating another step of manufacturing the semiconductor device continued from FIG. 17.

Subsequently, as illustrated in FIG. 18, after a silicon oxide film is formed on the n-type region NDR, the silicon oxide film is processed by using photolithography and dry etching techniques. Then, by a dry etching technique using the processed silicon oxide film as a hard mask HM, trenches TR are formed. The trenches TR are formed so as to penetrate through the n-type region NDR to reach the epitaxial layer EPI. At this time, the trenches TR are desirably processed as vertical as possible to constantly keep the channel width. By forming the trenches TR, a source region SR made of the n-type region NDR is formed in a region interposed between adjacent trenches TR.

Figure 19:
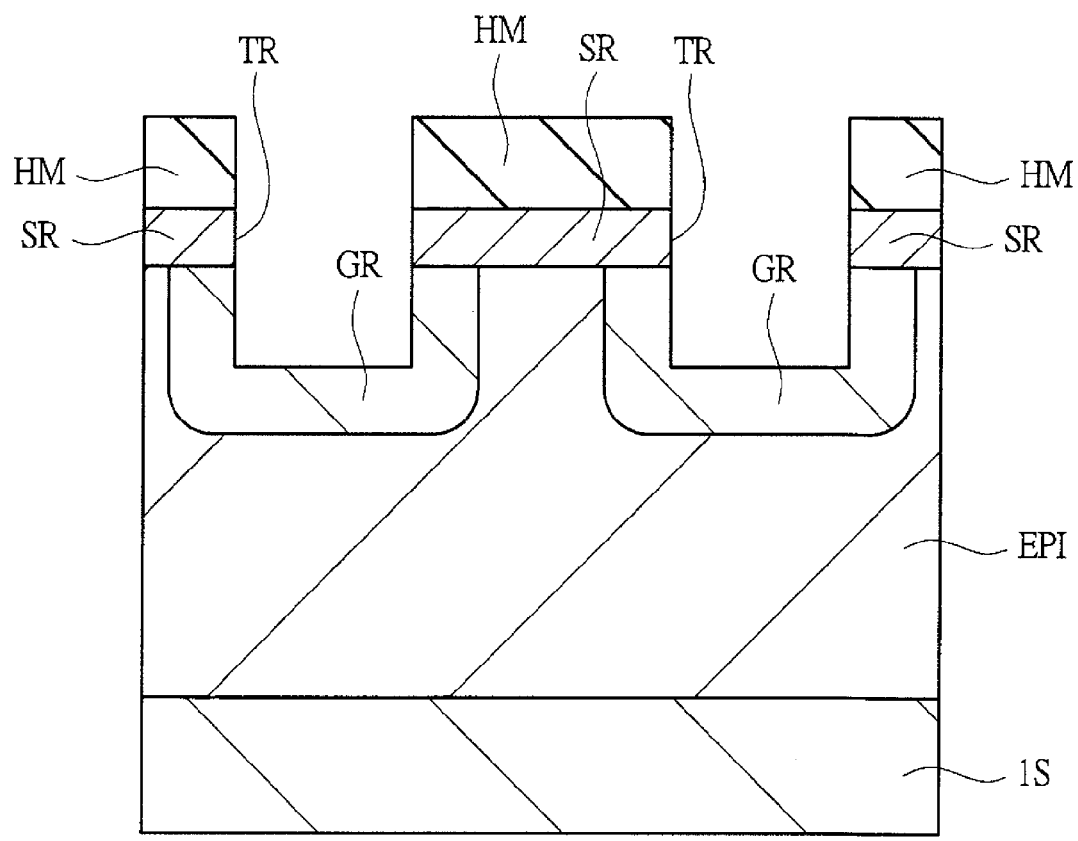
FIG. 19 is a cross-sectional view illustrating still another step of manufacturing the semiconductor device continued from FIG. 18.

Next, as illustrated in FIG. 19, by still using the hard mask HM (silicon oxide film) used in the process of the trenches TR, a gate region GR to be a p-type region is formed on side surfaces and a bottom surface of the trench TR. This gate region is formed by an ion implantation method. For example, in an ion implantation method for forming the gate region GR, ion species are aluminum. Then, the gate region GR is formed on the side walls of the trench TR by a tilted ion implantation method, and the gate region GR is formed on the bottom portion of the trench TR by a vertical ion implantation method. An angle in the tilted ion implantation method is 25 degrees (with reference to a vertical axis), and its energy is 100 keV at maximum. On the other hand, the vertical ion implantation method adopts a multi-stage implantation with energy of 150 keV at maximum. These ion implantation methods (tilted ion implantation method and vertical ion implantation method) are performed with heating the substrate 1S at 500° C. to decrease the gate resistance of the gate region GR. However, if about 5 V is acceptable for the gate blocking voltage of the gate region GR, the ion implantation for forming the gate region GR may be performed at room temperature.

Figure 20:
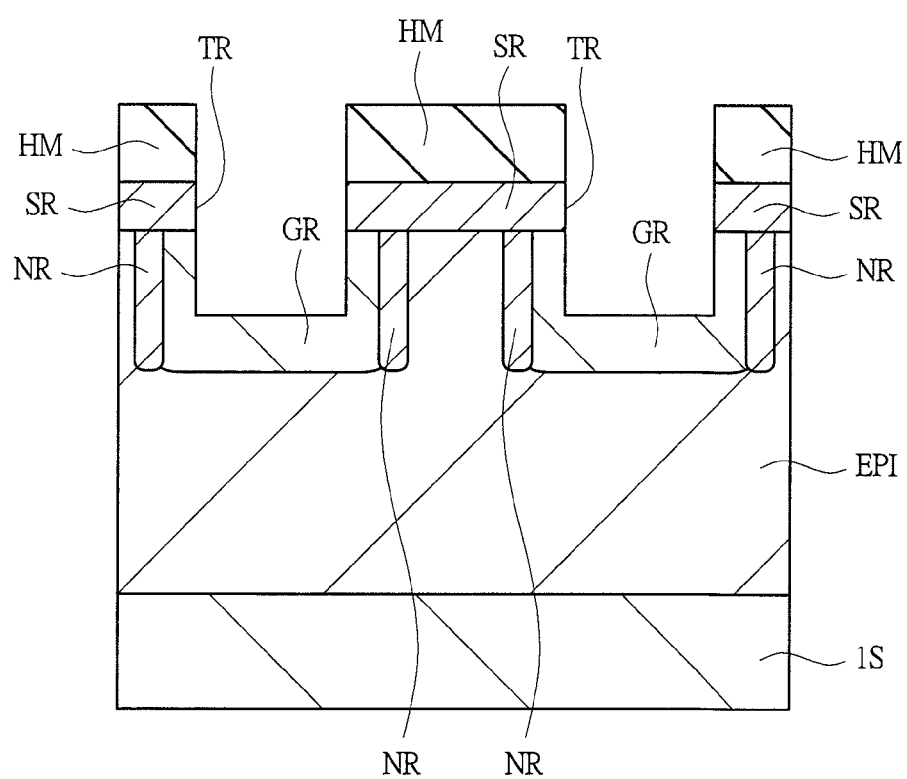
FIG. 20 is a cross-sectional view illustrating still another step of manufacturing the semiconductor device continued from FIG. 19.

Subsequently, as illustrated in FIG. 20, by still using the hard mask HM (silicon oxide film) used in the process of the trenches TR, an n-type impurity is doped between the gate region GR and the channel-formed region to form the n-type region NR. The n-type region NR is formed by a tilted ion implantation method. In this tilted ion implantation method, ion species are nitrogen, an implantation energy is 400 keV, and a dose amount is $6 \times 10^{12}$ cm$^{-2}$. In this manner, a peak concentration in a vicinity of a p-n junction with the gate region GR in the channel-formed region is about $8 \times 10^{12}$ cm$^{-2}$. An implantation angle in the tilted ion implantation method is 25 degrees which are the same as when the gate region GR is formed. However, the implantation angle may be about 26 to 30 degrees in order to prevent implanting the n-type impurity to excessive portions such as a corner portion of the trench TR.

Figure 21:
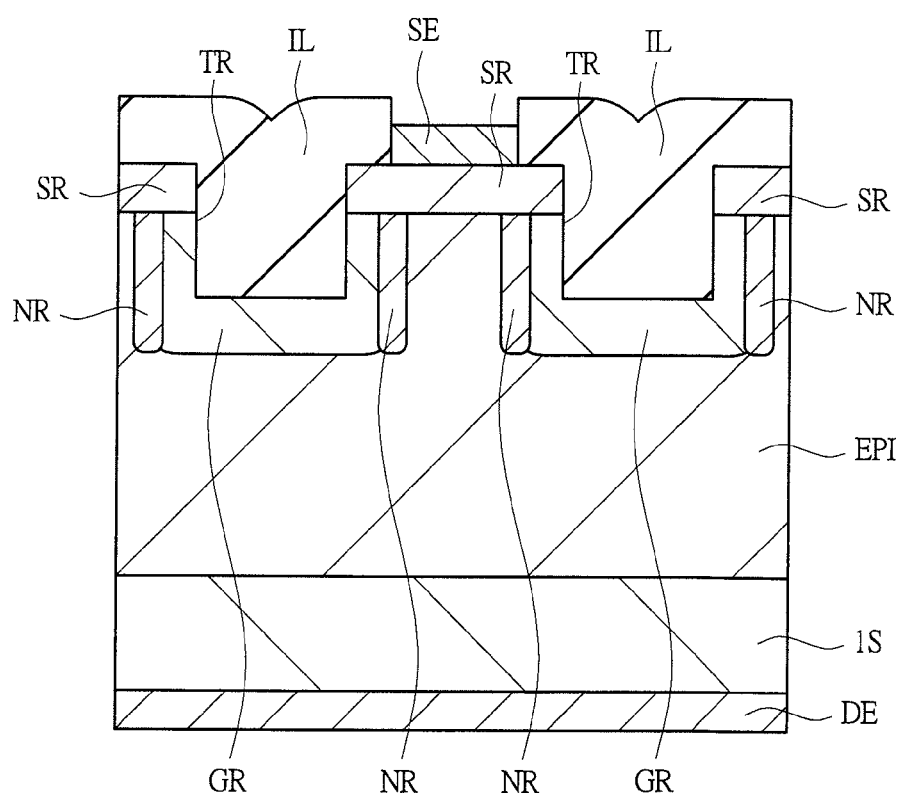
FIG. 21 is a cross-sectional view illustrating still another step of manufacturing the semiconductor device continued from FIG. 20.

Then, as illustrated in FIG. 21, activation annealing is performed at a temperature of about 1600° C. for sacrificial oxidation of a surface of the trench TR, and then, the trench TR is filled with an insulating film IL. The trench TR can be filled by forming a silicon oxide film on the substrate 1S including an inside of the trench TR and then etching-back this silicon oxide film. However, the etching-back is not limited as a planarization method, and other planarization methods such as a CMP (chemical mechanical polishing) method may be performed after forming the silicon oxide film on the substrate 1S including the inside of the trench TR.

Next, by using photolithography and etching techniques, the insulating film IL is patterned. The insulating film IL is patterned so that an upper portion of the source region SR is opened. Then, a nickel film (Ni film) is deposited on the insulating film IL including an inside of the opening portion, and then, a source electrode SE made of a nickel silicide film is formed by a heat treatment (annealing) at a temperature of about 1000° C. Then, an unreacted nickel film is removed. Similarly to a rear surface side of the substrate 1S, the nickel film is formed on the rear surface of the substrate 1S, and then, a heat treatment at a temperature of about 1000° C. is performed, so that a drain electrode DE made of a nickel silicide film is formed.

Finally, an interlayer insulating film made of a silicon oxide film is formed on the surface of the substrate 1S, and an aluminum wiring is formed in the interlayer insulating film. This aluminum wiring is formed as, for example, two layers. Then, an opening portion is formed in the aluminum wiring to form a source pad and a gate pad. In this manner, the junction FET according to the first embodiment can be manufactured.

Note that, although aluminum is used as a p-type impurity to be doped to the gate region GR and nitrogen is used as an n-type impurity to be doped to the n-type region NR in the first embodiment, the p-type impurity to be doped to the gate region GR may be boron and the n-type impurity to be doped to the n-type region NR may be phosphorus. It is known that outward diffusion of boron occurs when activation annealing is performed to a boron-doped film damaged by an ion implantation method. Therefore, by damaging the vicinity of the p-n junction with doping an n-type impurity for forming the n-type region NR, an effect resulting in the more abrupt p-n junction can be obtained. In a point of view of effectively forming the damage in the vicinity of the p-n junction, phosphorus whose mass is larger than that of nitrogen is easier to form the damage, and therefore, the abrupt p-n junction can be formed by a combination of boron and phosphorus. However, a concentration in a vicinity of the surface of the gate region GR is decreased due to the outward diffusion of boron, and therefore, it is necessary to take some actions such as an additional implantation of aluminum (p-type impurity) to the surface of the gate region GR.

Second Embodiment

Figure 22:
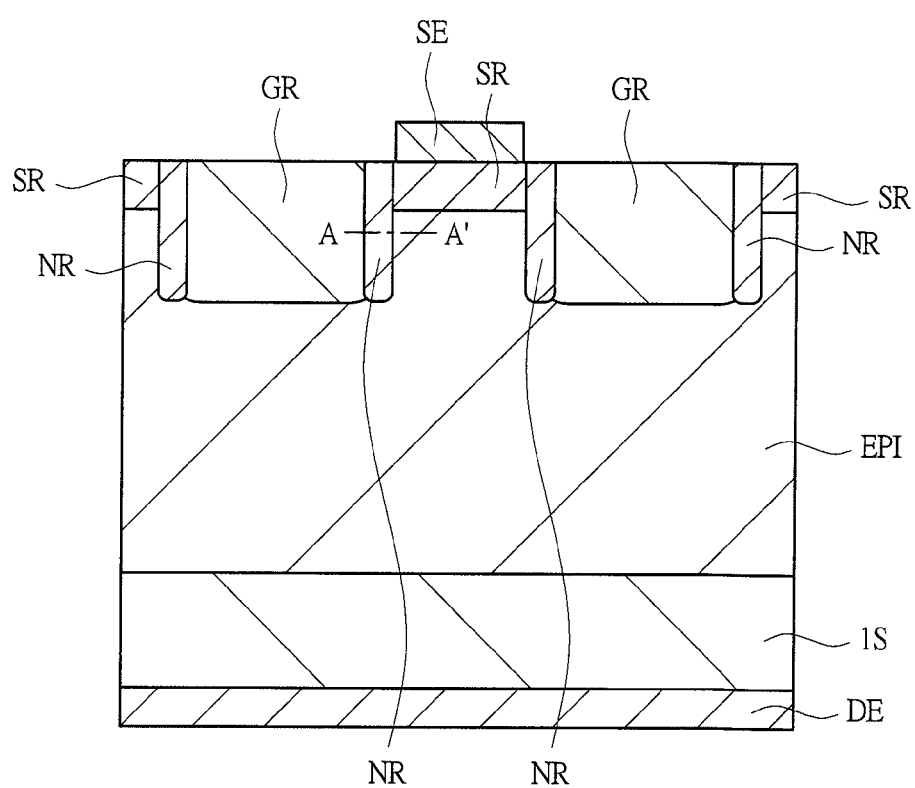
FIG. 22 is a cross-sectional view illustrating a structure of a junction FET according to a second embodiment.

FIG. 22 is a cross-sectional view illustrating a structure of a junction FET according to a second embodiment. A difference point of the junction FET in the second embodiment illustrated in FIG. 22 from that in the first embodiment illustrated in FIG. 4 is that the gate region GR does not have the trench structure but is formed by vertical ion implantation. Even if only vertical ion implantation is used to form the gate region GR as the second embodiment, implanted ions go round in a lateral direction, and therefore, the p-n junction formed between the gate region GR and the channel-formed region becomes gradual if any action is not taken. Accordingly, also in the second embodiment, by forming the n-type region NR between the gate region GR and the channel-formed region (in the vicinity of the p-n junction) similar to the first embodiment, the impurity profile of the p-n junction formed between the gate region GR and the channel-formed region can be abrupt, and the impurity concentration on the channel-formed region side of the p-n junction can be increased.

Figure 23:
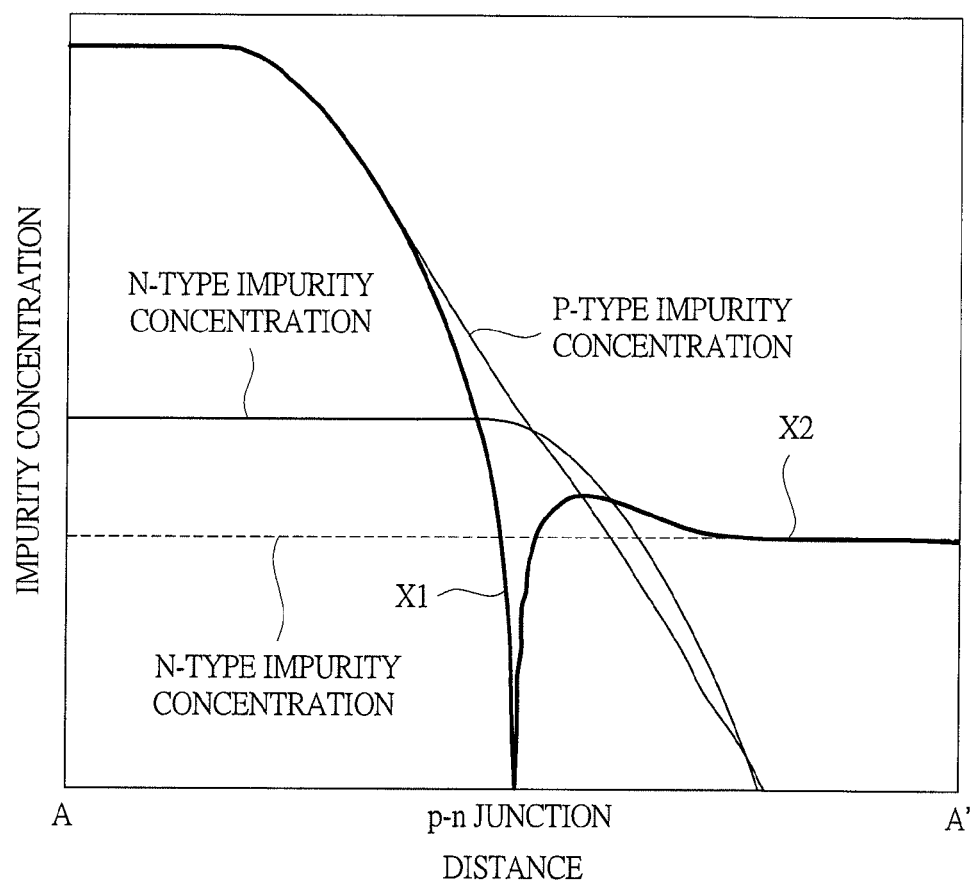
FIG. 23 is a graph illustrating an impurity profile taken along the line A-A' in FIG. 22.

FIG. 23 is a graph illustrating an impurity concentration taken along the line A-A' in FIG. 22. A point "A" side in FIG. 23 indicates the gate region GR to which a p-type impurity is doped with high concentration. On the other hand, a point "A'" side in FIG. 23 indicates the channel-formed region (epitaxial layer EPI) to which an n-type impurity is doped. And, the p-n junction is formed between the gate region GR and the channel-formed region. Here, in the second embodiment, since the n-type region NR is formed in the vicinity of the p-n junction, the n-type impurity is doped with high concentration in the vicinity of the p-n junction as illustrated in FIG. 23. Here, a curve X1 indicates a net concentration distribution of the impurity from the gate region GR to the p-n junction, and a curve X2 indicates a net concentration distribution of the impurity from the p-n junction to the channel-formed region. As illustrated in FIG. 23, it is found that a slope of the curve X1 in the vicinity of the p-n junction is abrupt, and further, the curve X2 in the vicinity of the p-n junction swells. This can be interpreted as follows. When considering the curve X1, the low-doped gate region GR (tail region) formed so as to tail in the vicinity of the p-n junction is cancelled by the formation of the n-type region NR, and as a result, the net impurity concentration in the vicinity of the p-n junction becomes abrupt. On the other hand, when considering the curve X2, the n-type impurity is highly doped also to the vicinity of the p-n junction on the channel-formed region side, and as a result, the impurity concentration of the p-n junction on the channel-formed region side is increased. As described above, in the second embodiment, by the formation of the n-type region NR between the gate region GR and the channel-formed region, the impurity profile of the p-n junction formed between the gate region GR and the channel-formed region can be abrupt, and also the impurity concentration of the p-n junction on the channel-formed region side can be increased. As a result, according to the second embodiment, the potential in the vicinity of the p-n junction can be difficult to be influenced by the drain bias in the blocking state, so that the blocking voltage can be improved, and further, the ON resistance can be decreased.

The junction FET in the second embodiment is configured as described above, and a method of manufacturing this junction FET is described below. Processes of the method are the same as up to those illustrated in FIG. 17 in the first embodiment. Subsequently, a silicon oxide film is formed on the substrate 1S, and this silicon oxide film is processed by using photolithography and etching techniques. Then, by a vertical ion implantation method with using the processed silicon oxide film as a hard mask, the gate region GR illustrated in FIG. 22 is formed. This gate region GR is a p-type region to which a p-type impurity is doped. At this time, since the gate region GR desirably has a depth of 0.5 μm or larger, an energy in the vertical ion implantation method is set to 500 keV at maximum.

Then, by an ion implantation method still using the hard mask used in the formation of the gate region GR, an n-type impurity is doped to the vicinity of the p-n junction between the gate region GR and the channel-formed region to form the n-type region NR. As the ion implantation method to form the n-type region NR, a tilted ion implantation method is desirably used rather than a vertical ion implantation method. This is because the n-type impurity for forming the n-type region NR has to be implanted to the vicinity of the p-n junction in the lateral direction. However, in the tilted ion implantation method, if the angle is too large, the n-type impurity is doped only to a region that is shallow when viewed from the surface of the substrate 1S, and conversely, if the angle is too small, the n-type impurity is doped even to a region that is deep when viewed from the surface of the substrate 1S. Therefore, the n-type impurity has to be doped at an appropriate angle.

The appropriate angle is toward a diagonal-line direction of a rectangle whose long side is the depth of the gate region GR and whose short side is a distance spreading in the lateral direction. In the second embodiment, since the depth of the gate region GR is about 0.5 μm and the spread in the lateral direction is about 0.2 μm, the implantation angle in the tilted ion implantation method is set to be about 22 degrees (with reference to the vertical axis). And, an energy is set to be 300 keV and a dose amount is set to be $5 \times 10^{12}$ $cm^{-2}$.

Note that the silicon oxide film is used as a hard mask in the second embodiment. However, in a point of view of uniformly implanting the n-type impurity for forming the n-type region NR in the depth direction of the substrate 1S, a material having a density close to that of the substrate 1S is desirably used for the hard mask for use in the ion implantation method. In this manner, also in the second embodiment, similar to the case of doping the n-type impurity to the trench, the concentration of the n-type impurity doped in the depth direction of the n-type region NR can be uniformed. Subsequent processes are almost the same with those of the first embodiment, and therefore, are omitted here.

Third Embodiment

Figure 24:
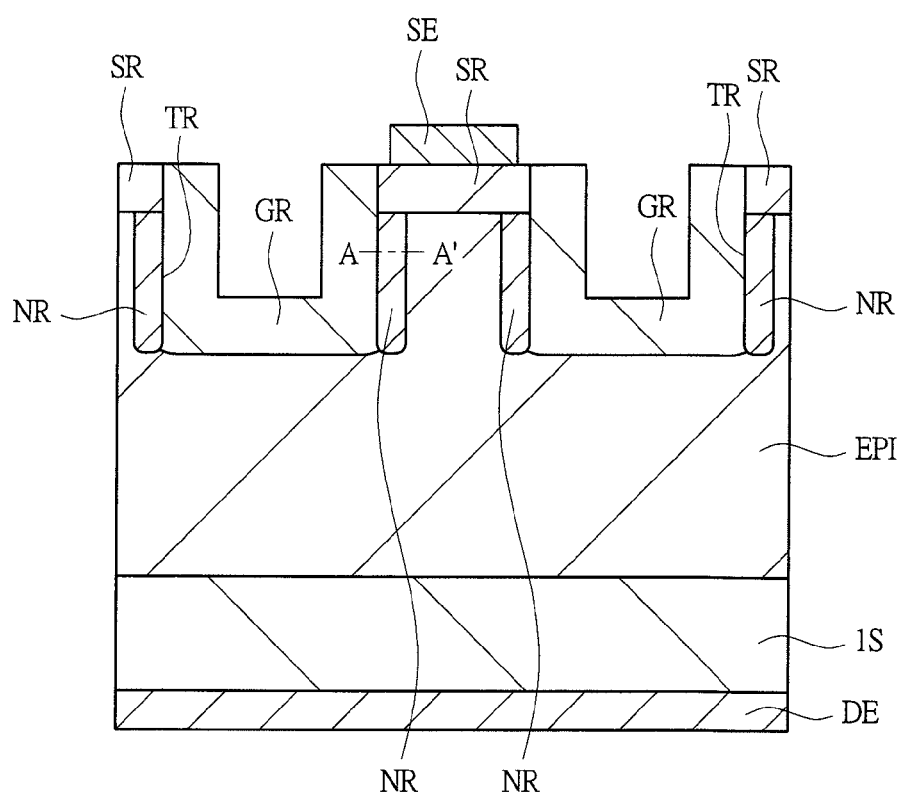
FIG. 24 is a cross-sectional view illustrating a structure of a junction FET according to a third embodiment.

FIG. 24 is a cross-sectional view illustrating a structure of a junction FET according to a third embodiment. A different point of the junction FET in the third embodiment illustrated in FIG. 24 from that in the first embodiment illustrated in FIG. 4 is that the gate region GR is formed by not the ion implantation method but an epitaxial growth method.

Figure 25:
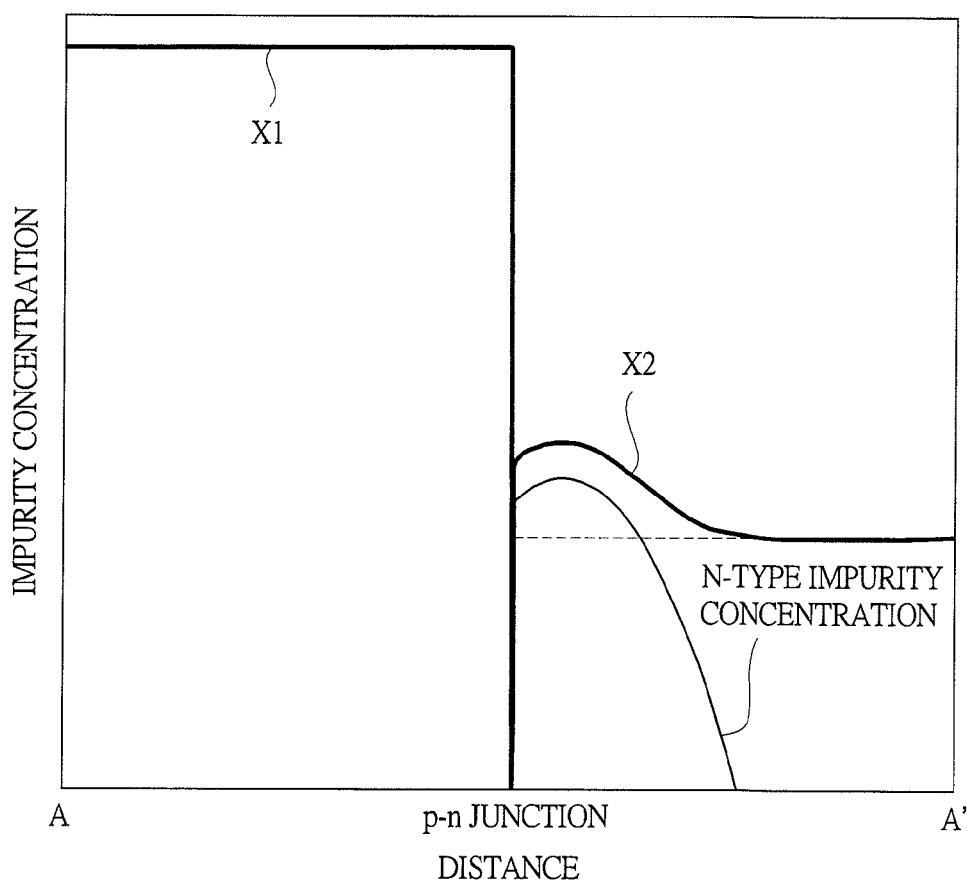
FIG. 25 is a graph illustrating an impurity profile taken along the line A-A' in FIG. 24.

FIG. 25 is a graph illustrating an impurity concentration taken along the line A-A' in FIG. 24. A point "A" side in FIG. 25 indicates the gate region GR to which a p-type impurity is doped with high concentration. On the other hand, a point "A'" side in FIG. 25 indicates the channel-formed region (epitaxial layer EPI) to which an n-type impurity is doped. And, the p-n junction is formed between the gate region GR and the channel-formed region. Here, in the third embodiment, since the n-type region NR is formed in the vicinity of the p-n junction, the n-type impurity is doped with high concentration in the vicinity of the p-n junction as illustrated in FIG. 25. Here, a curve X1 indicates a net concentration distribution of the impurity from the gate region GR to the p-n junction, and a curve X2 indicates a net concentration distribution of the impurity from the p-n junction to the channel-formed region. As illustrated in FIG. 25, since the gate region GR is formed by the epitaxial growth method, a slope of the curve X1 in the vicinity of the p-n junction is abrupt. Further, also in the third embodiment, since the n-type region NR is formed in the vicinity of the p-n junction, the curve X2 in the vicinity of the p-n junction swells. As a result, according to the third embodiment, the potential in the vicinity of the p-n junction can be difficult to be influenced by the drain bias in the blocking state, so that the blocking voltage can be improved, and further, the ON resistance can be decreased. And, in the third embodiment, since the gate region GR is formed by the epitaxial growth method, the p-n junction between the gate region GR and the source region SR is difficult to be damaged by the ion implantation method, so that the blocking voltage between the gate region GR and the source region SR can be improved.

The junction FET in the third embodiment is configured as described above, and a method of manufacturing this junction FET is described below. As illustrated in FIG. 24, the epitaxial layer EPI is formed on the substrate 1S. Then, trenches TR are formed on the epitaxial layer EPI. At this time, a space between the trenches TR is formed so as to be narrower than that in the first embodiment. This is because the space between the trenches TR is to be a channel width in the third embodiment. For example, in a junction FET of a normally-off type, the channel width is required to be about 0.5 μm or smaller, although depending on the concentration.

Next, an n-type impurity is doped to side walls of the trench TR by an ion implantation method. In this manner, the n-type region NR can be formed on the epitaxial layer EPI exposed on the side walls of the trench TR. At this time, since a region to which the n-type impurity is to be doped is in vicinities of side-wall surfaces of the trench TR, an energy in the ion implantation method is set to be 10 key. Then, the source region SR is formed. Note that, although the source region SR may be formed before or after the formation of the trench TR, the source region SR is formed, for example, after the formation of the trench TR in the third embodiment.

Subsequently, to activate the impurities doped in the epitaxial layer EPI, annealing is performed. Then, by using the epitaxial growth method on the side walls and a bottom surface of the trench TR, the p-type region is grown to form the gate region GR. Then, by photolithography and dry etching techniques, excessively-grown p-type regions are removed. Subsequent processes are almost the same with those of the first embodiment. In this manner, the junction FET according to the third embodiment can be manufactured.

Fourth Embodiment

Figure 26:
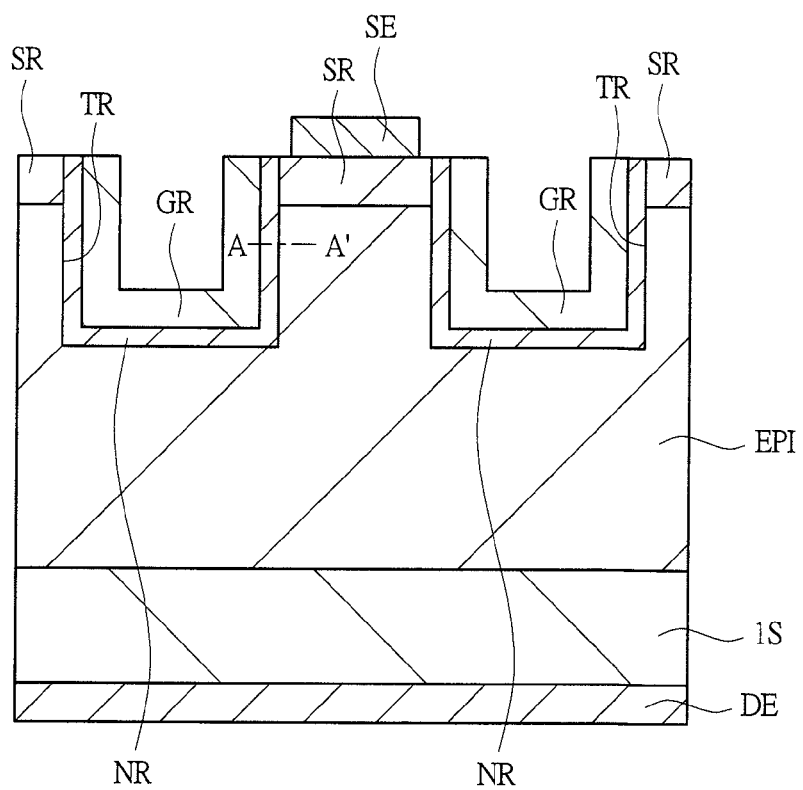
FIG. 26 is a cross-sectional view illustrating a structure of a junction FET according to a fourth embodiment.

FIG. 26 is a cross-sectional view illustrating a structure of a junction FET according to a fourth embodiment. A different point of the junction FET in the fourth embodiment illustrated in FIG. 26 from that in the first embodiment illustrated in FIG. 4 is that both of the n-type region NR and the gate region GR are formed by not an ion implantation method but an epitaxial growth method.

Figure 27:
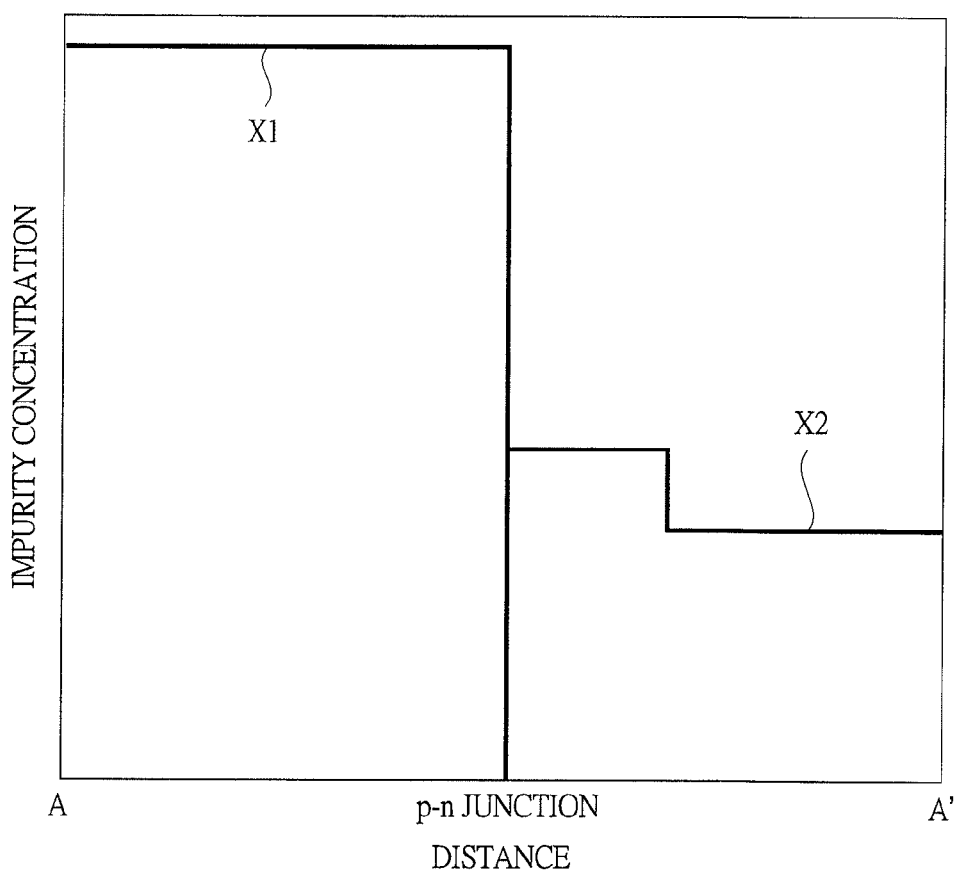
FIG. 27 is a graph illustrating an impurity profile taken along the line A-A' in FIG. 26.

FIG. 27 is a graph illustrating an impurity concentration taken along the line A-A' in FIG. 26. A point "A" side in FIG. 27 indicates the gate region GR to which a p-type impurity is doped with high concentration. On the other hand, a point "A'" side in FIG. 27 indicates the channel-formed region (epitaxial layer EPI) to which an n-type impurity is doped. And, the p-n junction is formed between the gate region GR and the channel-formed region. Here, in the fourth embodiment, since the n-type region NR is formed in the vicinity of the p-n junction, the n-type impurity is doped with high concentration in the vicinity of the p-n junction as illustrated in FIG. 27. Here, a curve X1 indicates a net concentration distribution of the impurity from the gate region GR to the p-n junction, and a curve X2 indicates a net concentration distribution of the impurity from the p-n junction to the channel-formed region. As illustrated in FIG. 27, since the gate region GR is formed by the epitaxial growth method, a slope of the curve X1 in the vicinity of the p-n junction is abrupt. Similarly, also in the fourth embodiment, since the n-type region NR formed in the vicinity of the p-n junction is formed by the epitaxial growth method, the curve X2 in the vicinity of the p-n junction is stepwise increased. As a result, according to the fourth embodiment, a potential in the vicinity of the p-n junction can be difficult to be influenced by the drain bias in the blocking state, so that the blocking voltage can be improved, and further, the ON resistance can be decreased. And, in the fourth embodiment, the gate region GR and the n-type region NR are formed by the epitaxial growth method. That is, according to the fourth embodiment, since impurities are not doped to a vicinity region of the gate region GR by an ion implantation method, an effect of decreasing a leak current of the gate region GR can be obtained.

The junction FET in the fourth embodiment is configured as described above, and a method of manufacturing this junction FET is described below. As illustrated in FIG. 26, the epitaxial layer EPI is formed on the substrate 15. Then, trenches TR are formed on the epitaxial layer EPI. At this time, a space between the trenches TR is formed so as to be narrower than that in the third embodiment. This is because the space between the trenches TR is to be a channel width in the third embodiment. For example, in a junction FET of a normally-off type, the channel width is required to be about 0.2 μm or smaller, although depending on the concentration.

Next, the n-type region NR is formed by the epitaxial growth method on side walls and a bottom surface of the trench TR. An impurity concentration of this n-type region NR is higher than that of the epitaxial layer EPI. In this manner, the n-type region NR can be formed on the epitaxial layer EPI exposed on the side walls of the trench TR. Then, the source region SR is formed. Note that, although the source region SR may be formed before or after the formation of the trench TR, the source region SR is formed, for example, after the formation of the trench TR in the fourth embodiment.

Subsequently, by using the epitaxial growth method on the side walls and the bottom surface of the trench TR, the p-type region is grown on the n-type region NR to form the gate region GR. Then, by using photolithography and dry etching techniques, excessively-grown p-type regions are removed. Subsequent processes are almost the same with those of the first embodiment. In this manner, the junction FET according to the fourth embodiment can be manufactured.

Fifth Embodiment

Figure 28:
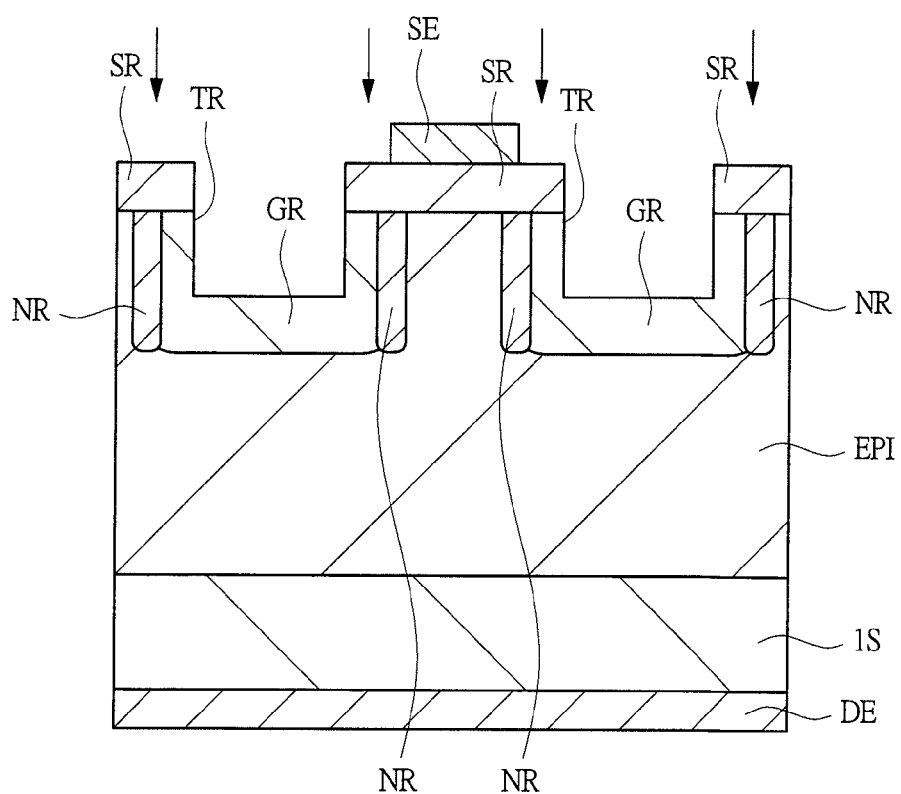
FIG. 28 is a cross-sectional view illustrating a structure of a junction FET according to a fifth embodiment.

FIG. 28 is a cross-sectional view illustrating a structure of a junction FET according to a fifth embodiment. A different point of the junction FET in the fifth embodiment illustrated in FIG. 28 from that in the first embodiment illustrated in FIG. 4 is that the n-type region NR is formed by not a tilted ion implantation method but a vertical ion implantation method (high-energy implantation method in a vertical direction).

In this manner, also in the fifth embodiment, by forming the n-type region NR between the gate region GR and the channel-formed region, an impurity profile of the p-n junction formed between the gate region GR and the channel-formed region can be abrupt, and further, an impurity concentration of the p-n junction on the channel-formed region side can be increased. As a result, according to the fifth embodiment, a potential in the vicinity of the p-n junction can be difficult to be influenced by the drain bias in the blocking state similar to the first embodiment, so that the blocking voltage can be improved, and further, the ON resistance can be decreased.

The junction FET in the fifth embodiment is configured as described above, and a method of manufacturing this junction FET is described below. As illustrated in FIG. 28, after the epitaxial layer EPI is formed on the substrate 15 and before the trenches TR are formed, a silicon oxide film is formed on the epitaxial layer EPI. Then, the silicon oxide film is processed by using photolithography and dry etching techniques. By a vertical ion implantation method with using this processed silicon oxide film as a hard mask, the n-type region NR is formed in the epitaxial layer EPI. The process of forming this n-type region NR may be replaced in order by a process of forming a semiconductor region, such as the source region SR, formed on a surface region of the epitaxial layer EPI. In the vertical ion implantation method for forming the n-type region NR, the n-type impurity has to be doped down to about the depth of the trench TR, and therefore, an energy of about 2 MeV at maximum is required. On the other hand, a dose amount may be less by an amount vertically doped, and may be about $1 \times 10^{12}$ cm$^{-2}$.

Then, after the trenches TR are formed on the epitaxial layer EPI, the gate region GR is formed in the epitaxial layer EPI in contact with side walls and a bottom surface of the trench TR. At this time, the n-type region NR described above is disposed in the vicinity of the p-n junction formed between the gate region GR and the channel-formed region. Subsequent processes are almost the same with those of the first embodiment. In this manner, the junction FET in the fifth embodiment can be manufactured.

Sixth Embodiment

Figure 29:
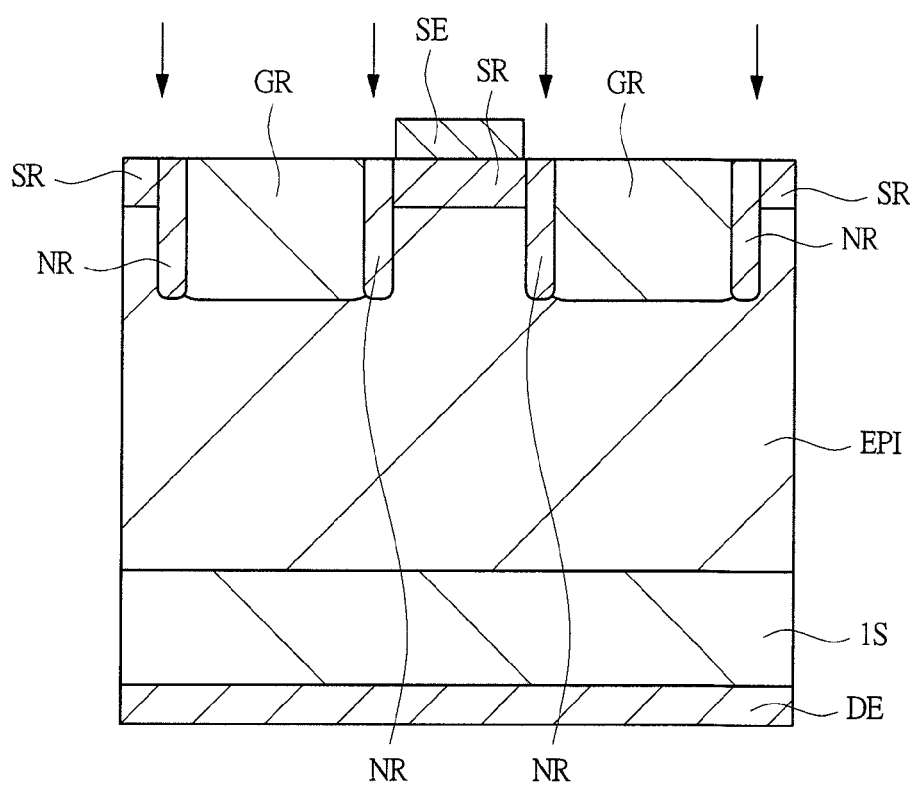
FIG. 29 is a cross-sectional view illustrating a structure of a junction FET according to a sixth embodiment.

FIG. 29 is a cross-sectional view illustrating a structure of a junction FET according to a sixth embodiment. A different point of the junction FET in the sixth embodiment illustrated in FIG. 29 from that in the second embodiment illustrated in FIG. 22 is that the n-type region NR is formed by not a tilted ion implantation method but a vertical ion implantation method (high-energy implantation method in a vertical direction). Here, although doping conditions of an n-type impurity by the vertical ion implantation method are almost the same with those of the fifth embodiment, an energy for doping the n-type impurity has to be adjusted because a depth of the gate region GR is different from that of the fifth embodiment.

In this manner, also in the sixth embodiment, by forming the n-type region NR between the gate region GR and the channel-formed region, an impurity profile of the p-n junction formed between the gate region GR and the channel-formed region can be abrupt, and further, an impurity concentration of the p-n junction on the channel-formed region side can be increased. As a result, according to the sixth embodiment, a potential in the vicinity of the p-n junction can be difficult to be influenced by the drain bias in the blocking state similar to the second embodiment, so that the blocking voltage can be improved, and further, the ON resistance can be decreased.

Seventh Embodiment

Figure 30:
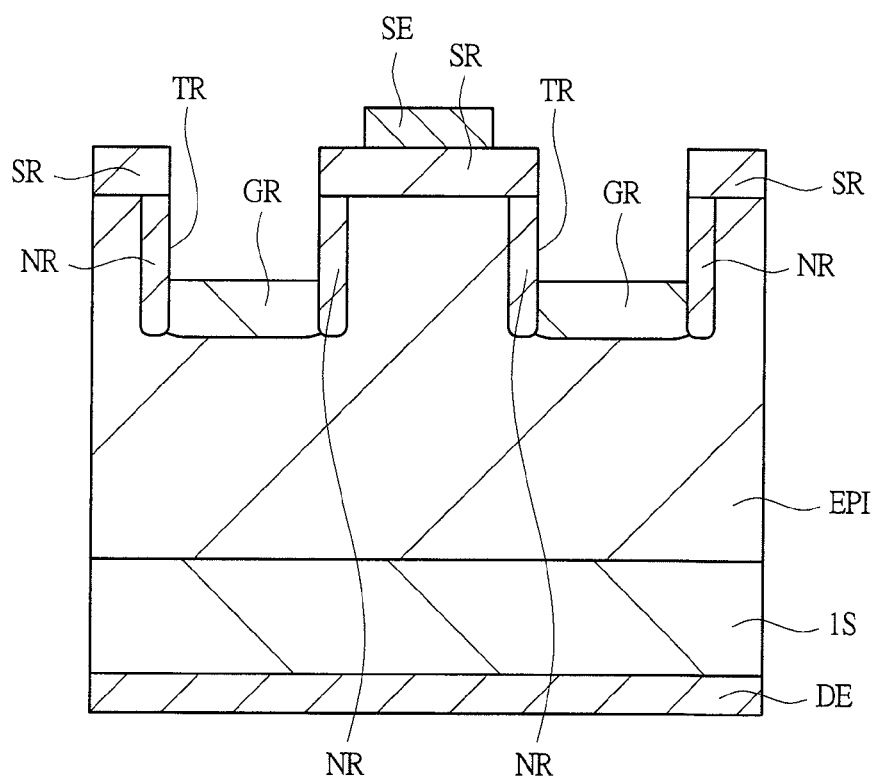
FIG. 30 is a cross-sectional view illustrating a structure of a junction FET according to a seventh embodiment.

FIG. 30 is a cross-sectional view illustrating a structure of a junction FET according to a seventh embodiment. A different point of the junction FET in the seventh embodiment illustrated in FIG. 30 from that in the first embodiment illustrated in FIG. 4 is that the gate region GR is not formed on side walls of the trench TR but formed on only the bottom portion of the trench TR. As the seventh embodiment, even if the gate region GR is formed on only the bottom portion of the trench TR by the ion implantation method, the n-type impurity spreads in a lateral direction, and therefore, the p-n junction between the gate region GR and the channel-formed region becomes gradual. Therefore, also in the seventh embodiment, the structure of forming the n-type region NR between the gate region GR and the channel-formed region is useful. By this structure, an impurity profile of the p-n junction formed between the gate region GR and the channel-formed region can be abrupt, and further, an impurity concentration of the p-n junction on the channel-formed region side can be increased. As a result, according to the seventh embodiment, a potential in the vicinity of the p-n junction can be difficult to be influenced by the drain bias in the blocking state, so that the blocking voltage can be improved, and further, the ON resistance can be decreased.

The junction FET in the seventh embodiment is configured as described above, and a method of manufacturing the junction FET is described below. As illustrated in FIG. 30, after the epitaxial layer EPI is formed on the substrate 1S, a hard mask formed of, for example, a silicon oxide film is formed on the epitaxial layer EPI. Then, by using this hard mask for masking, trenches TR reaching an inside from a surface of the epitaxial layer EPI are formed. Then, with still using the hard mask used for forming the trenches TR, a gate region GR made of a p-type region is formed in the epitaxial layer EPI in contact with the bottom portion of the trench TR by a vertical ion implantation method.

Next, the n-type region NR is formed by doping an n-type impurity. The n-type impurity to form the n-type region NR is required to be doped by a tilted ion implantation method angled to cancel a p-type impurity going around the source region SR. The angle is set to be about 26 degrees in consideration of the depth of the gate region GR formed on the bottom portion of the trench TR of about 0.4 μm. However, if this angle is increased, the impurities may be blocked by the hard mask and not reach the bottom portion of the trench TR, and therefore, attention to this is required. Also, since a dose amount of the n-type impurity for forming the n-type region NR is less than that of the p-type impurity for forming the gate region GR by an order of magnitude, an implantation energy of the n-type impurity is preferably higher than that of the p-type impurity forming the gate region GR by about 100 to 200 keV so that a low-doped region (tail region) of the p-type impurity is cancelled. Other processes are the same with those of the first embodiment.

Note that, in the seventh embodiment, the n-type impurity for forming the n-type semiconductor NR is implanted to a part of side walls of the trench TR connecting between the channel-formed region and the source region SR, and therefore, it is possible to obtain an accompanied effect of decreasing a resistance value in the side-wall region of the trench TR to which the n-type impurity is doped.

Eighth Embodiment

Figure 31:
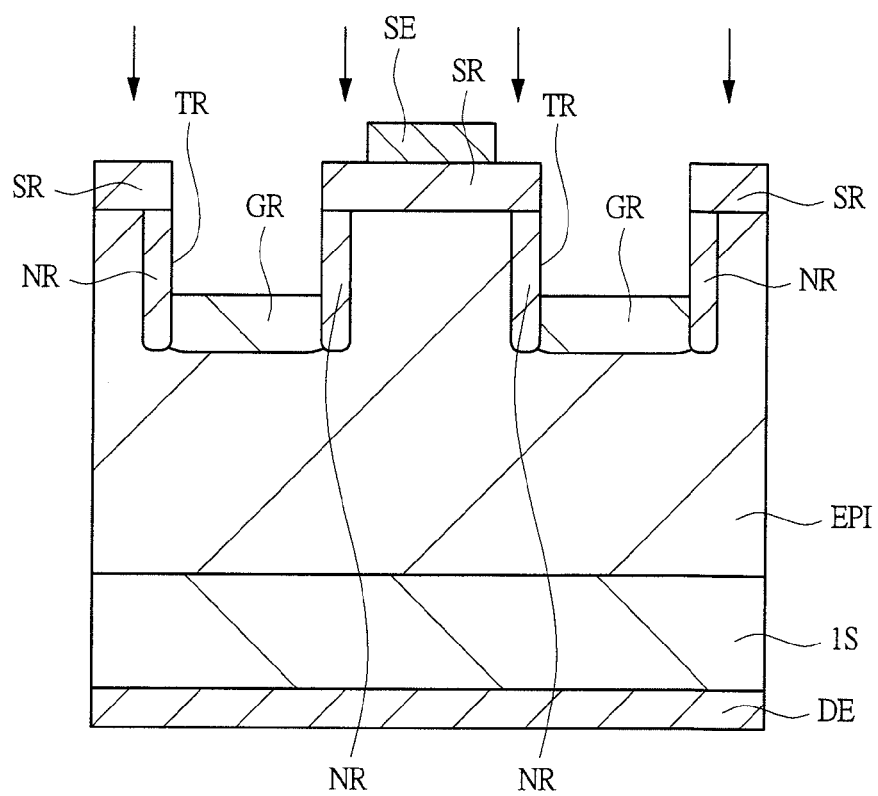
FIG. 31 is a cross-sectional view illustrating a structure of a junction FET according to an eighth embodiment.

FIG. 31 is a cross-sectional view illustrating a structure of a junction FET according to an eighth embodiment. A different point of the junction FET in the eighth embodiment illustrated in FIG. 31 from that in the seventh embodiment illustrated in FIG. 30 is that the n-type impurity for forming the n-type region NR is doped by not a tilted ion implantation method but a vertical ion implantation method. Also in the eighth embodiment, the structure of forming the n-type region NR between the gate region GR and the channel-formed region is useful. By this structure, an impurity profile of the p-n junction formed between the gate region GR and the channel-formed region can be abrupt, and further, an impurity concentration of the p-n junction on the channel-formed region side can be increased. As a result, according to the eighth embodiment, a potential in the vicinity of the p-n junction can be difficult to be influenced by the drain bias in the blocking state, so that the blocking voltage can be improved, and further, the ON resistance can be decreased.

The junction FET in the eighth embodiment is configured as described above, and a method of manufacturing this junction FET is described below. As illustrated in FIG. 31, after the epitaxial layer EPI is formed on the substrate 1S and before the trenches TR are formed, a silicon oxide film is formed on the epitaxial layer EPI. Then, the silicon oxide film is processed by using photolithography and dry etching techniques. By a vertical ion implantation method with using this processed silicon oxide film as a hard mask, the n-type region NR is formed in the epitaxial layer EPI. In doping conditions of the n-type impurity by the vertical ion implantation method at this time, it is required to adjust an implanted position and depth depending on a spread in a lateral direction of a p-type impurity doped in processes described later. The process of forming this n-type region NR may be replaced in order by a process of forming a semiconductor region, such as the source region SR, formed on a surface region of the epitaxial layer EPI.

Then, after the trenches TR are formed on the epitaxial layer EPI, the gate region GR is formed in the epitaxial layer EPI in contact with a bottom surface of the trench TR. At this time, the n-type region NR described above is disposed in the vicinity of the p-n junction formed between the gate region GR and the channel-formed region. Subsequent processes are almost the same with those of the first embodiment. In this manner, the junction FET in the eighth embodiment can be manufactured.

Ninth Embodiment

Figure 32:
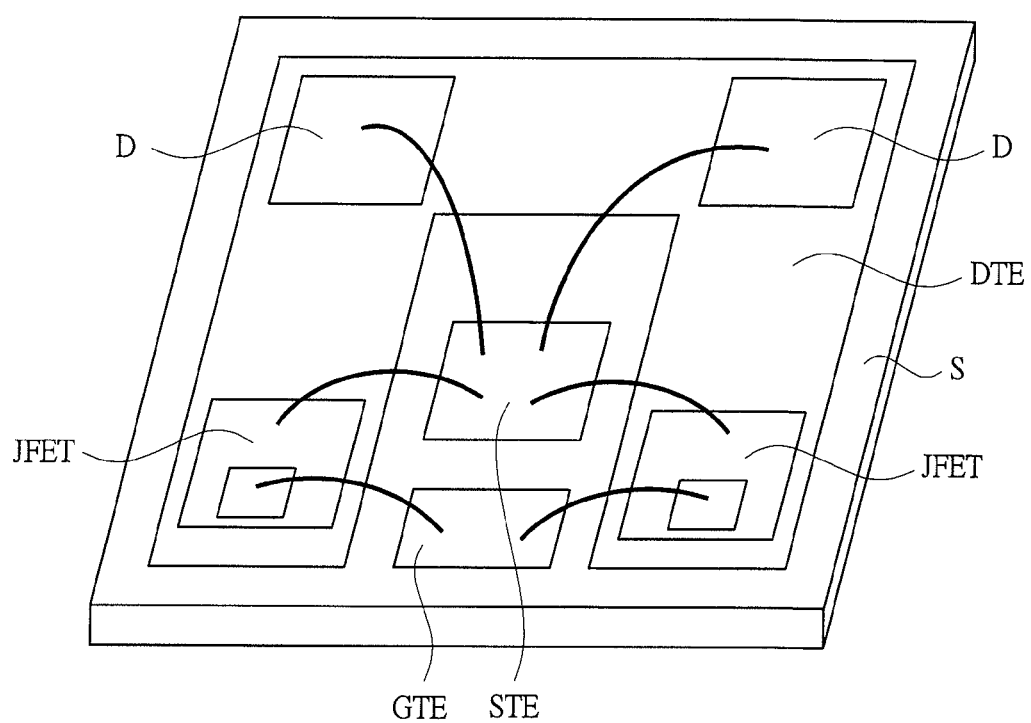
FIG. 32 is a diagram illustrating a state in which the junction FET is mounted on an insulating substrate.

In a ninth embodiment, an example of a product (semiconductor device) using the junction FET described in any of the first to eighth embodiments is described. FIG. 32 illustrates an example that the junction FET in any of the first to eighth embodiments is mounted on an insulating substrate. As illustrated in FIG. 32, a metal plate configuring a source terminal "STE", a gate terminal "DTE", and a drain terminal "DTE" is disposed on an insulating substrate "S" made of aluminum nitride, and a junction FET "JFET" and a diode "D" are bonded onto the drain terminal DTE by solder. A source electrode of the junction FET JFET is electrically connected to the source terminal STE by a wire, and a gate electrode of the junction FET JFET is electrically connected to the gate terminal GTE via a wire. Similarly, the anode of the diode D is electrically connected to the source terminal STE by a wire. Here, a Schottky barrier diode made of silicon carbide (SiC) is used for the diode D. This is because the Schottky barrier diode made of silicon carbide (SiC) has not only a lower ON voltage than that of a p-n junction diode made of silicon (Si) but also a small switching loss because of a unipolar device. In this manner, the junction FET in any of the first to eighth embodiments is mounted on the insulating substrate. Here, since the junction FET in any of the first to eighth embodiments has a large current density of about 500 A/cm², failures may occur due to its heat problem when replaced with the junction FET, and therefore, a junction FET having a slightly-decreased current density of about 400 A/cm² is used.

Figure 33:
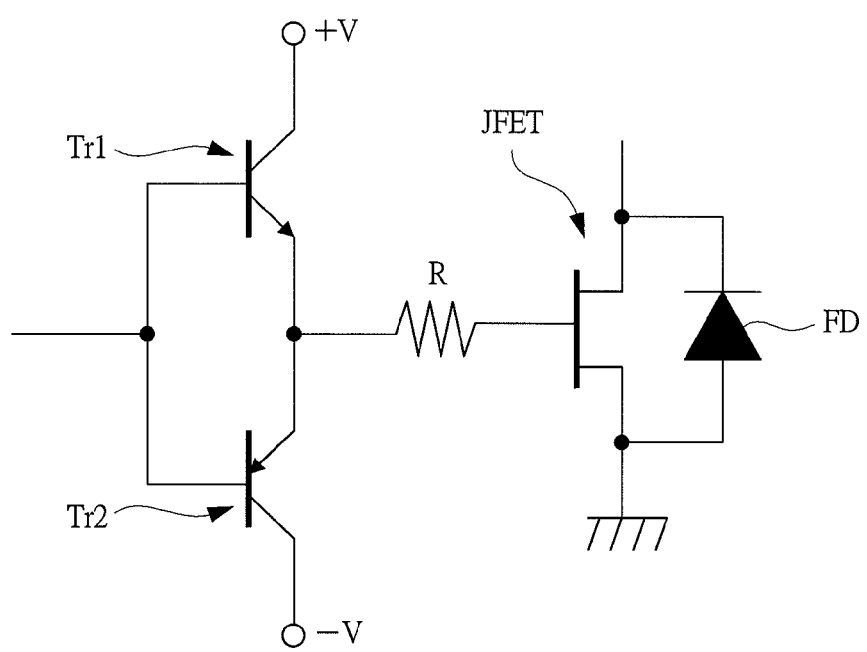
FIG. 33 is a circuit diagram illustrating an example in which a gate-driver circuit is connected to the junction FET according to the first to eighth embodiments.

FIG. 33 illustrates an example that a gate driver circuit is connected to the junction FET JFET according to any of the first to eighth embodiments. As illustrated in FIG. 33, a transistor "Tr1" and a transistor "Tr2" are connected to each other in series between a positive power supply and a negative power supply, and an output terminal between the transistor Tr1 and the transistor Tr2 is connected to the gate electrode of the junction FET JFET in any of the first to eighth embodiments via a resistor R. And, a free-wheel diode "FD" is connected in anti-parallel to the junction FET JFET in any of the first to eighth embodiments. Since the junction FET JFET in any of the first to eighth embodiments has a small threshold voltage of about 1 V, positive and negative power supplies are used in order to increase its switching speed and prevent its abnormal operations. However, only the positive power supply may be used when a current is small to cause small noise.

Figure 34:
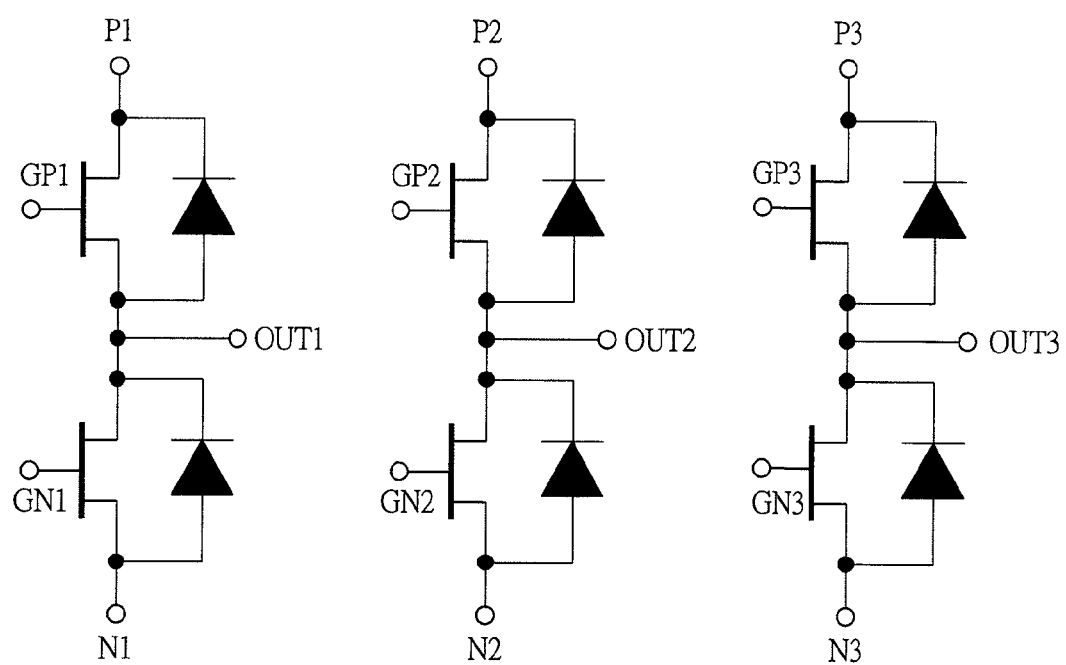
FIG. 34 is a circuit diagram illustrating a three-phase inverter using the junction FET according to the first to eighth embodiments.

FIG. 34 illustrates an example that the junction FET in any of the first to eighth embodiments is used for a three-phase inverter. In FIG. 34, the junction FET in any of the first to eighth embodiments is used as junction FETs GP1 to GP3 and GN1 to GN3. More specifically, in a first phase, the junction FETs GP1 and GN1 are connected to each other in series between terminals P1 and N1. Further, also in a second phase, the junction FETs GP2 and GN2 are connected to each other in series between terminals P2 and N2. Similarly, also in a third phase, the junction FETs GP3 and GN3 are connected to each other in series between terminals P3 and N3.

The three-phase inverter illustrated in FIG. 34 is the one in which Si-insulated gate bipolar transistor (Si-IGBT) used in a 600-V system is replaced by the junction FET in any of the first to eighth embodiments. In this manner, since the junction FET in any of the first to eighth embodiments has a low ON resistance in the three-phase inverter, its conductive loss can be decreased, and further, its switching loss can be decreased because of the unipolar device. As a result, by replacing Si-IGBT by the junction FET in any of the first to eighth embodiments, the losses of the three-phase inverter can be decreased by about 40% in total. As already described above, the junction FET with the slightly-decreased current density is used in the ninth embodiment, and therefore, if the mounting technique and a cooling technique are developed in the future, its circuit loss can be further decreased.

In the foregoing, the invention made by the inventors has been concretely described based on the embodiments. However, it is needless to say that the present invention is not limited to the foregoing embodiments and various modifications and alterations can be made within the scope of the present invention.

The present invention can be also used for any junction FET such as a lateral-channel junction FET other than those in the first to eighth embodiments. Further, all of the first to eighth embodiments describe the example that silicon carbide is used as a substrate material. However, the substrate material is not limited to this, and a wide-bandgap semiconductor material such as gallium nitride can be used as the substrate material.

The present invention can be widely used in manufacture industries of manufacturing semiconductor devices.

What is claimed is:
1. A semiconductor device comprising:
(a) a semiconductor substrate of a first conductive type to be a drain layer;
(b) an epitaxial layer of a first conductive type formed on the semiconductor substrate;
(c) a plurality of trenches each formed so as to reach an inside of the epitaxial layer from a surface of the epitaxial layer;
(d) a source layer of a first conductive type formed on a surface region of the epitaxial layer interposed between trenches adjacent to each other;
(e) a gate layer of a second conductive type formed in the epitaxial layer so as to contact with side walls and a bottom portion of each of the plurality of trenches;
(f) a channel-formed region of a first conductive type formed in the epitaxial layer between portions of the gate layer adjacent to each other;
(g) a drain electrode formed on a rear surface of the semiconductor substrate;
(h) a source electrode formed so as to connect to the source layer; and
(i) a gate electrode formed so as to connect to the gate layer, wherein
in a horizontal direction, an impurity concentration of a first conductive type impurity doped in a junction region forming a p-n junction with the gate layer in the channel-formed region formed between the portions of the gate layer adjacent to each other is higher than an impurity concentration of a first conductive type impurity doped in a center region in the channel-formed region.

2. The semiconductor device according to claim 1, wherein a peak of the impurity concentration of the junction region forming the p-n junction with the gate layer in the channel-formed region is twice or more and five times or less as high as that of the epitaxial layer.

3. The semiconductor device according to claim 2, wherein the impurity concentration of the epitaxial layer is lower than that of the semiconductor substrate.

4. The semiconductor device according to claim 1, wherein a substrate material of the semiconductor substrate is silicon carbide.

5. The semiconductor device according to claim 4, wherein the first conductive type is an n type, and the second conductive type is a p type.

6. The semiconductor device according to claim 5, wherein impurities doped in the gate layer are aluminum or boron, and
impurities doped in the channel-formed region are nitrogen or phosphorus.

7. The semiconductor device according to claim 1, wherein a substrate material of the semiconductor substrate is gallium nitride.

8. A semiconductor device comprising:
(a) a semiconductor substrate of a first conductive type to be a drain layer;
(b) an epitaxial layer of a first conductive type formed on the semiconductor substrate;
(c) a plurality of trenches each formed so as to reach an inside of the epitaxial layer from a surface of the epitaxial layer;
(d) a source layer of a first conductive type formed on a surface region of the epitaxial layer interposed between trenches adjacent to each other;
(e) a gate layer of a second conductive type formed in the epitaxial layer so as to contact with a bottom portion of each of the plurality of trenches;
(f) a channel-formed region of a first conductive type formed in the epitaxial layer between portions of the gate layer adjacent to each other;
(g) a drain electrode formed on a rear surface of the semiconductor substrate;
(h) a source electrode formed so as to connect to the source layer; and
(i) a gate electrode formed so as to connect to the gate layer, wherein
in a horizontal direction, an impurity concentration of a first conductive type impurity doped in a junction region forming a p-n junction with the gate layer in the channel-formed region formed between the portions of the gate layer adjacent to each other is higher than an impurity concentration of a first conductive type impurity doped in a center region in the channel-formed region.

9. The semiconductor device according to claim 8, wherein a peak of the impurity concentration of the junction region forming the p-n junction with the gate layer in the channel-formed region is twice or more and five times or less as high as that of the epitaxial layer.

10. A semiconductor device comprising:
(a) a semiconductor substrate of a first conductive type to be a drain layer;
(b) an epitaxial layer of a first conductive type formed on the semiconductor substrate;
(c) a source layer of a first conductive type formed so as to dispose portions of the source layer apart from each other at a constant distance on a surface region of the epitaxial layer;
(d) a gate layer of a second conductive type formed in the epitaxial layer between portions of the source layer adjacent to each other, the gate layer being deeper than the source layer;
(e) a channel-formed region of a first conductive type formed in the epitaxial layer between portions of the gate layer adjacent to each other;
(f) a drain electrode formed on a rear surface of the semiconductor substrate;
(g) a source electrode formed so as to connect to the source layer; and
(h) a gate electrode formed so as to connect to the gate layer, wherein
in a horizontal direction, an impurity concentration of a first conductive type impurity doped in a junction region forming a p-n junction with the gate layer in the channel-formed region formed between the portions of the gate layer adjacent to each other is higher than an impurity concentration of a first conductive type impurity doped in a center region in the channel-formed region.

11. The semiconductor device according to claim 10, wherein
a peak of the impurity concentration of the junction region forming the p-n junction with the gate layer in the channel-formed region is twice or more and five times or less as high as that of the epitaxial layer.

* * * * *